(12) United States Patent
Miura

(10) Patent No.: US 6,789,224 B2
(45) Date of Patent: Sep. 7, 2004

(54) METHOD AND APPARATUS FOR TESTING SEMICONDUCTOR DEVICES

(75) Inventor: Takeo Miura, Tokyo (JP)

(73) Assignee: Advantest Corporation, Tokyo (JP)

( * ) Notice: Subject to any disclaimer, the term of this patent is extended or adjusted under 35 U.S.C. 154(b) by 552 days.

(21) Appl. No.: 09/761,199

(22) Filed: Jan. 16, 2001

(65) Prior Publication Data

US 2001/0052097 A1 Dec. 13, 2001

(30) Foreign Application Priority Data

Jan. 18, 2000 (JP) .................................. 2000-009113
Jun. 14, 2000 (JP) .................................. 2000-178917

(51) Int. Cl.[7] .......................... G01R 31/28; G06F 19/00
(52) U.S. Cl. .................... 714/744; 702/72; 702/117; 324/765; 365/193
(58) Field of Search .......................... 714/718, 719, 714/721, 724, 735, 736, 738, 740, 244; 324/76, 77, 158.1, 765; 340/658; 365/193, 194, 201, 233; 327/145, 161, 175, 263, 291; 702/72, 89, 117

(56) References Cited

U.S. PATENT DOCUMENTS

| 4,924,468 | A | | 5/1990 | Horak et al. |
|---|---|---|---|---|
| 5,365,527 | A | | 11/1994 | Honma |
| 5,578,935 | A | | 11/1996 | Burns |
| 5,717,353 | A | * | 2/1998 | Fujimoto .................. 327/276 |
| 5,909,448 | A | | 6/1999 | Takahashi |
| 5,964,894 | A | | 10/1999 | Kurihara |
| 6,016,565 | A | | 1/2000 | Miura |
| 6,092,227 | A | * | 7/2000 | Toki et al. .................. 714/736 |
| 6,154,074 | A | * | 11/2000 | Nakashima ................ 327/163 |
| 6,263,463 | B1 | * | 7/2001 | Hashimoto .................. 714/724 |
| 6,360,343 | B1 | * | 3/2002 | Turnquist .................. 714/731 |
| 6,377,065 | B1 | * | 4/2002 | Le et al. .................. 324/765 |
| 6,479,983 | B1 | * | 11/2002 | Ebiya .................. 324/158.1 |

FOREIGN PATENT DOCUMENTS

| CN | 5111857 | 9/1996 |
|---|---|---|
| JP | 04 076473 | 3/1992 |
| JP | 10073645 | 3/1998 |
| KR | 0011596 | 7/1991 |
| KR | 92 003658 | 2/1992 |

* cited by examiner

Primary Examiner—Albert Decady
Assistant Examiner—Mathew C. Dooley
(74) Attorney, Agent, or Firm—David N. Lathrop, Esq.; Gallagher & Lathrop

(57) ABSTRACT

Data output from a semiconductor device under test and a reference clock output therefrom in synchronization with the data are sampled by slightly phased-apart multiphase strobe pulses. The phases of points of change of the output data and the reference clock are obtained from the sampled outputs, then the phase difference between them is measured, and a check is made to determine if the phase difference falls within a predetermined range, thereby evaluating the semiconductor device under test on a pass/fail basis.

24 Claims, 19 Drawing Sheets

| DNO | | | | | | | | |
|---|---|---|---|---|---|---|---|---|
| 8 | 7 | 6 | 5 | 4 | 3 | 2 | 1 | 0 |
| 7 | 6 | 5 | 4 | 3 | 2 | 1 | 0 | -1 |
| 6 | 5 | 4 | 3 | 2 | 1 | 0 | -1 | -2 |
| 5 | 4 | 3 | 2 | 1 | 0 | -1 | -2 | -3 |
| 4 | 3 | 2 | 1 | 0 | -1 | -2 | -3 | -4 |
| 3 | 2 | 1 | 0 | -1 | -2 | -3 | -4 | -5 |
| 2 | 1 | 0 | -1 | -2 | -3 | -4 | -5 | -6 |
| 1 | 0 | -1 | -2 | -3 | -4 | -5 | -6 | -7 |
| | 1 | 2 | 3 | 4 | 5 | 6 | 7 | 8 |

→ RNO

FIG.20 B

80 REFERENCE TABLE (Y-ADDRESS) DNO

| | | | | | | | | |
|---|---|---|---|---|---|---|---|---|
| 8 | F | F | F | F | F | P | P | P |
| 7 | F | F | F | F | P | P | P | P |
| 6 | F | F | F | P | P | P | P | P |
| 5 | F | F | P | P | P | P | P | F |
| 4 | F | P | P | P | P | P | F | F |
| 3 | P | P | P | P | P | F | F | F |
| 2 | P | P | P | P | F | F | F | F |
| 1 | P | P | P | F | F | F | F | F |
| | 1 | 2 | 3 | 4 | 5 | 6 | 7 | 8 |

→ RNO (X-ADDREESS)

METHOD AND APPARATUS FOR TESTING SEMICONDUCTOR DEVICES

BACKGROUND OF THE INVENTION

The present invention relates to a semiconductor device testing method and apparatus suitable for use in testing semiconductor devices that have built-in fast write and read type memories.

Before entering into an explanation of the prior art to which the present invention pertains, a description will be given, with reference to FIG. 1, of the general outlines of a semiconductor IC tester.

The IC tester, identified generally by TES, comprises a main controller 13, a pattern generator 14, a timing generator 15, a waveform formatter 16, a logic comparator 12, a driver 17, a signal readout circuit 11, a failure analysis memory 18, a logical amplitude reference voltage source 19, a comparison reference voltage source 21 and a device power source 22.

The main controller 13 is usually formed by a computer system and operates under the control of a test program prepared by a user, mainly controlling the pattern generator 14 and the timing generator 15. The pattern generator 14 generates test pattern data, which is converted by the waveform formatter 16 to a test pattern signal of the same waveform as the actual one. The test pattern signal is provided to the driver 17 from which it is output as a waveform of an amplitude value set in the logical amplitude reference voltage source 19 and is applied to a memory under test DUT for storage therein.

A response signal read out of a memory cell of the semiconductor device under test DUT is provided to the signal readout circuit 11, wherein its logical value is read out, that is, sampled by a strobe pulse. The logic comparator 12 compares the thus read-out logical value with an expected value fed from the pattern generator 14. If a mismatch is found between the logic value and the expectation, it is decided that a memory cell of the address from which the response signal was read out is failing, and upon each occurrence of such a failure, the faulty address is stored in the failure analysis memory 18 for use in deciding, after completion of the test, whether the failed cell is repairable.

FIG. 1 is a diagrammatic showing of the tester configuration for one pin alone, but in practice the depicted configuration is provided for each pin of the memory DUT; that is, for each pin the test pattern is input to the memory DUT and the response signal is read out therefrom.

Among semiconductor memories is a memory (hereinafter referred to also as a semiconductor device) of the type that performs the writing and reading of data thereto and therefrom in synchronization with a clock.

FIG. 2 shows how this kind of memory is read out. FIG. 2A depicts pieces of data DA, DB, DC, . . . that are output from (a pin of) memory, respective test cycles TD1, TD2, TD3, . . . being divided off by broken lines. FIG. 2B shows a clock DQS that is output from the memory. As shown, the pieces of data DA, DB, DC, . . . are output from the memory in synchronization with the clock DQS. When the semiconductor IC is in actual use, the clock is used as a sync signal (data strobe) to pass the pieces of data DA, DB, DC, . . . to other circuits.

The testing the semiconductor device of this kind includes an item of measuring time difference or intervals (phase differences) dI1, dI2, dI3, . . . between the rise and fall timing of the clock (hereinafter referred to as a reference clock) DQS and the points of change of the data. The smaller the time differences, the faster the response and consequently the higher the level of performance characteristic. In other words, the grade of the memory under test depends on the above-mentioned time differences.

While the semiconductor device (memory) is in actual use, a clock from a clock source is applied to a circuit in the semiconductor device, from which data is output in synchronization with the clock. Accordingly, in the testing of the semiconductor device by the tester, too, a clock is fed from the tester to the semiconductor device under test and is passed through its internal circuit, thereafter being output therefrom, together with data, as the reference clock DQS for providing the output data to the tester. The tester measures the rise and fall timing of the reference clock DQS and the time intervals dI1, dI2, dI3, . . . between the measured timing of the rise and fall of the reference clock DQS and the points of change of the pieces of data DA, DB, DC, . . .

Since the reference clock DQS is output from the semiconductor device under test after passing through its inside as mentioned above, the rise and fall timing of the reference clock DQS is greatly affected by internal circuit operations of the semiconductor device under test and environmental conditions such as ambient temperature. For example, as depicted in FIG. 3 in which there are shown reference clock pulses DQSA, DQSB and DQSC that are output from individual semiconductor devices under test A, B and C, the reference clock pulses DQSA, DQSB and DQSC are phased apart. This phase difference is caused not only by device-to-device variation but also by the difference in the memory address accessed in the respective semiconductor device and by jitter J of the rise and fall timing of each reference clock that is caused by an increase in the device temperature due to an extended period of operation as indicated by the broken lines.

With the point of measurement set at timing with too wide a margin of safety against such variations or fluctuations in performance characteristics of the devices under test, there is fear of a device of normal operation being decided as defective; the possibility of such a wrong decision gets stronger particularly with an increase in the operating frequency of the device.

Accordingly, it is necessary to accurately measure the time intervals dI1, dI2, dI3, . . . between the rise and fall timing of the reference clock DQS and the points of change of the pieces of data DA, DB, DC, . . . This requires accurate measurement of the rise and fall timing of the reference clock DQS.

To this end, it is customary in the prior art to measure the rise and fall timing of the reference clock DQS while gradually shifting the timing for the application of the strobe pulse to the signal readout circuit of the tester, the measurement results being used to measure the time intervals dI1, dI2, dI3, . . . .

FIG. 4 is a block diagram depicting a conventional arrangement for measuring the rise and fall timing of the reference clock DQS. A level comparator 10 comprises a pair of voltage comparators CP1 and CP2, by which it is decided whether the logical value of the reference clock DQS output from the semiconductor device DUT satisfies normal voltage conditions. The voltage comparator CP1 decides whether the voltage value of the logical "H" value of the reference clock DQS is above a normal voltage value VOH. The voltage comparator CP2 decides whether the voltage value of the logical "L" value of the reference clock DQS is below a normal voltage value VOL.

These decision results are provided to the signal readout circuit 11, which measures the rise and fall timing of the reference clock DQS. Upon each application thereto of the strobe pulse STB, the signal readout circuit 11 reads out the logical value input at that time.

FIG. 5A shows the reference clock DQS that is provided for each test cycle TD. FIG. 5B shows strobe pulses STB that are applied to the signal readout circuit 11 over a sequence of test cycles TD. The strobe pulses STB are phased τT apart with respect to the reference clock DQS as depicted in FIG. 5B. That is, for each test cycle the strobe pulse STB is applied to the signal readout circuit 11 to read out (sample) the outputs from the voltage comparators CP1 and CP2. The output-side arrangement of the voltage comparator CP2, though not shown in FIG. 4, is identical with the depicted arrangement of the voltage comparator CP1.

The logic comparator 12 compares the logical value output from the signal readout circuit 11 with a predetermined expected value (in the FIG. 4 example, the logical "H" value) and, upon matching, outputs a pass signal PA (FIG. 5C) indicating that the device under test or memory cell is nondefective. Based on the generation timing of the strobe pulse STB1 (FIG. 5B) (the generation timing of the strobe pulse STB being known) to which the signal readout circuit 11 responded to read out the reversal of the output from the level comparator 10 to the logical "H" value, the time T1 from the beginning of the test cycle to the generation of the strobe pulse STB1 is detected, and the rise timing of the reference clock DQS is determined accordingly.

The fall timing of the reference clock DQS is detected by starting the retrieval after the reference clock DQS rose to the logical "H" value and then by determining, as is the case with the detection of the rise timing, the fall timing based on the generation timing of the strobe pulse STB to which the signal readout circuit 11 responded to read out the reversal of the output from the voltage comparator CP2 to the logical "H" value.

As described above, it is conventional to measure the generation timing of the reference clock DQS by the use of the signal readout circuit 11 built in the semiconductor device tester and the timing measuring means that utilizes the strobe pulse STB which is applied to the signal readout circuit 11. Accordingly, the test cycle TD needs to be repeated for measuring only the rise and fall timing of the reference clock DQS, resulting in much time being taken to measure the time intervals dI1, dI2, dI3, . . . .

Furthermore, the rise and fall timing of the reference clock DQS must be measured for all addresses of the memory under test, and in order to exclude the influence of the afore-mentioned jitter by an increase in the device temperature, the measurement of the rise and fall timing of the reference clock DQS needs to be made for all test patterns involved and hence is particularly time-consuming.

It is possible that the time for measuring the rise and fall timing of the reference clock DQS is shortened by widening the phase difference τT between respective the strobe pulses STB to thereby decrease the number of times the test cycle is repeated, but such widening of the phase difference τT reduces the accuracy of measurement of the rise and fall timing of the reference clock DQS, resulting in an impairment in the reliability of measured values of the time intervals dI1, dI2, dI3, . . . between the reference clock DQS and the points of change of the pieces of data DA, DB, DC, . . . .

SUMMARY OF THE INVENTION

It is therefore an object of the present invention to provide a semiconductor device testing method and apparatus that permit fast, accurate measurement of rising and falling transition points or timing of the reference clock.

Another object of the present invention is to provide a semiconductor device testing method and apparatus that require the one-time-only generation of all test patterns and hence are capable of conducting a pass/fail test on semiconductor devices in a short time and with higher accuracy.

The semiconductor device testing method according to the present invention is to evaluate a device under test in accordance with the phase differences (time differences) between the points of change of respective pieces of data output from the device under test and the points of change (rising or falling transition points) of a reference clock output from the device under test in synchronization with the output data from the device under test. Multiphase pulses are generated which are sequentially phased apart little by little with respect to a predetermined phase position of each test cycle, and the multiphase pulses are used as strobe pulses to sample the reference clock and the phases of the change points of the reference clock are detected from the sampled outputs.

According to an aspect of this invention method, the detected phases of the points of change of the reference clock are converted to the corresponding phase numbers of the multiphase pulses and stored in a memory, from which they are read out to make the evaluation of the device under test based on the above-mentioned phase differences.

The phase detection of the change points of the reference clocks and the conversion of the detected phases to the corresponding phase numbers are carried out for all addresses of the device under test, and the converted phase numbers are stored in the memory at the addresses corresponding to those of the device under test. The above-mentioned phase differences are obtained by reading out the phase numbers from the memory at the addresses corresponding to signals to be applied to the device under test.

Alternatively, the detection of the phases of the points of changes of the reference clocks and the conversion of the detected phases to the phase numbers are performed in the order of generating test patterns that are applied to the device under test at the time of its evaluation. The converted phase numbers are stored in the memory at addresses representing the order of generation of the test patterns, and the above-mentioned phase differences are obtained by reading out the phase numbers from the memory at the addresses indicating the order of generation of the test patterns.

At the timing preset corresponding to the phase numbers read out of the memory, a strobe pulse is generated, and at the timing of this strobe pulse, the logical value of the output data from the device under test is read out to obtain the above-mentioned phase differences for the evaluation of the device under test.

According to another aspect of this invention method, the output data from the device under test is sampled by strobe pulses formed by the multiphase pulses, then the phases of the points of change of the output data, that is, the phases of the rise or fall transition points of the data are detected using the sampled outputs by the multiphase strobe pulses, and the positions of these detected points of change of the output data are converted to the phase numbers of the multiphase pulses, respectively. The phase numbers of the points of change of the device output data and the phase numbers of the points of change of the reference clock are used to make a check to determine if the phase differences between these points of changes of the device output data and the reference clock are within a predetermined range, thereby evaluating the device under test on a pass/fail basis.

The testing apparatus according to the present invention is an apparatus which evaluates a device under test in accordance with the phase differences (time differences) between the points of change of respective pieces of data output from the device under test and the points of change (rising or falling transition points) of a reference clock output from the device under test in synchronization with the output data from the device under test. Strobe pulses formed by multiphase pulses, which are sequentially phased apart little by little, are generated by a multiphase pulse generating means. The reference clock output from the device under test is sampled by the respective strobe pulses in a plurality of reference signal readout circuits, whose outputs are provided to reference phase number output means, from which the phase numbers of strobe pulses immediately following the points of change of the reference clock are output their phases.

According to an aspect of this invention apparatus, the phase numbers output from the reference phase number output means are stored in a memory at addresses corresponding to address signals applied to the device under test. The phase numbers read out of the memory at the addresses corresponding to the address signals applied to the device under test are each used to select predetermined strobe pulse generation timing by a timing selector, and at the selected timing a strobe pulse is generated by a strobe pulse generator. The strobe pulse is applied to a data readout circuit to read out the logical value of the device output data.

Alternatively, the phase numbers output from the reference phase number output means are stored in a memory at addresses representing the order of generation of test patterns applied to the device under test. The phase numbers read out of the memory at such addresses are each used to select predetermined strobe pulse generation timing by the timing selector, and at the selected timing a strobe pulse is generated by the strobe pulse generator. The strobe pulse is applied to the data readout circuit to read out the logical value of the device output data.

According to another aspect of this invention apparatus, plural data signal readout circuit groups, each consisting of plural data signal readout circuits, are provided for each piece of output data from the device under test, and in the plural data signal readout circuits of each group the device output data is sampled by the multiphase strobe pulses corresponding thereto. The outputs from the plural data signal readout circuits for each group are provided to data phase number output means, from which are output the phase numbers of the strobe pulses immediately after the points of change of the output data. The respective phase numbers output from the respective data phase number output means and the phase numbers from the reference phase number output means are provided to a pass/fail results output part, from which is output a decision result as to whether the phase differences between the points of change of the output data and the reference clock fall within a predetermined range.

In the pass/fail results output part the difference between the phase number from the reference number output means and the phase number from each data phase number output means is detected as a phase difference in a phase comparison part, and a check is made in a pass/fail decision part to determine if these phase differences fall within the predetermined range.

In the pass/fail results output part, for example, the phase number from the reference phase number output means is input to one address of plural reference tables and each phase number from each data phase number output means is input to the other address of the corresponding reference tables. From the respective reference tables are output pass/fail results indicating whether the phase differences between the points of change of the reference clock and the respective pieces of output data fall within the predetermined range.

BRIEF DESCRIPTION OF THE DRAWINGS

FIG. 20A is an example of a table showing differences between the data phase number and the reference phase number;

FIG. 20B is a diagram showing, by way of example, stored contents of a reference table 80 in FIG. 19;

DETAILED DESCRIPTION OF THE PREFERRED EMBODIMENTS

Figure 1:
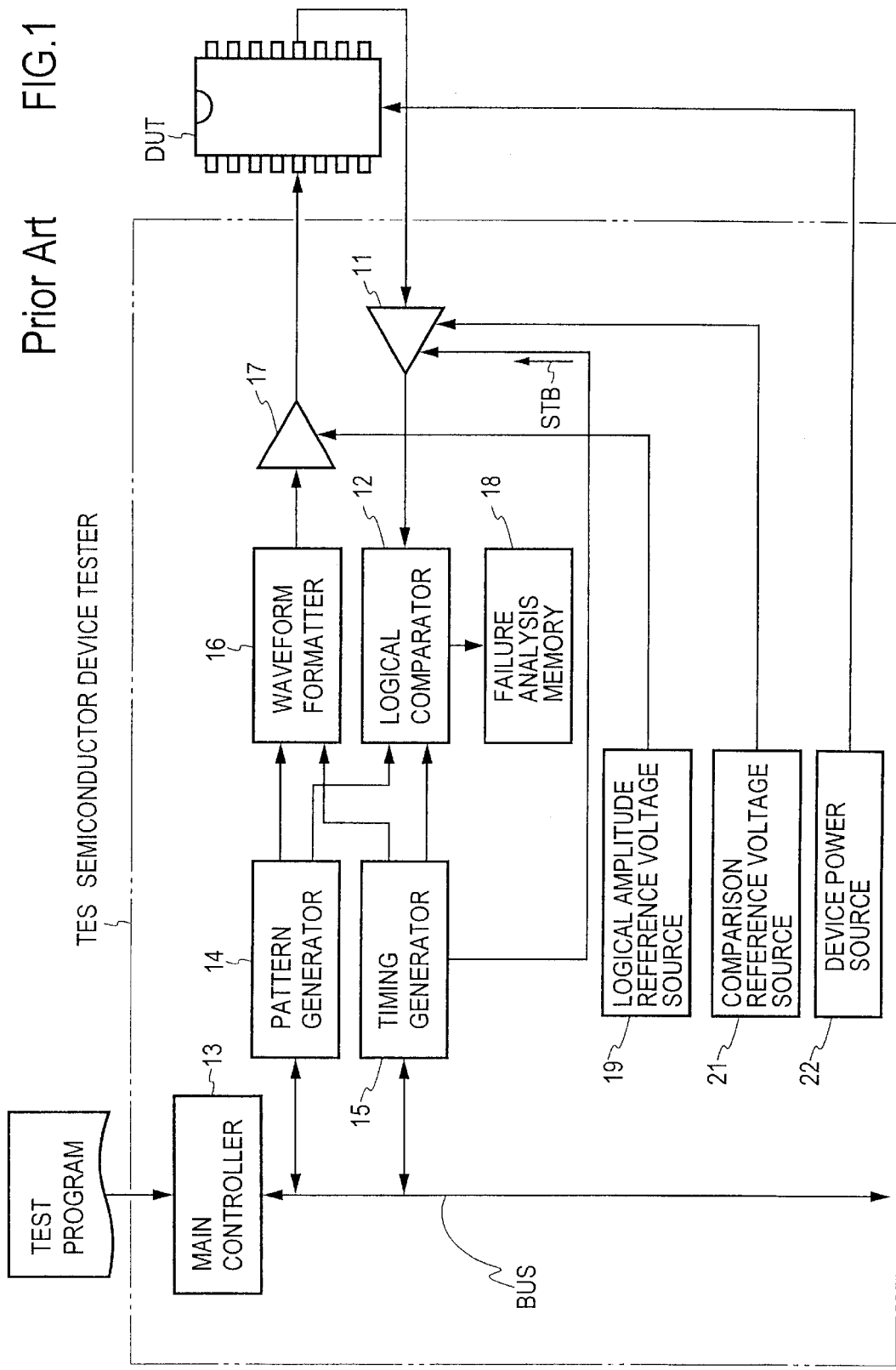
FIG. 1 is a block diagram for explaining the general outlines of a conventional semiconductor device tester.
Figure 2:
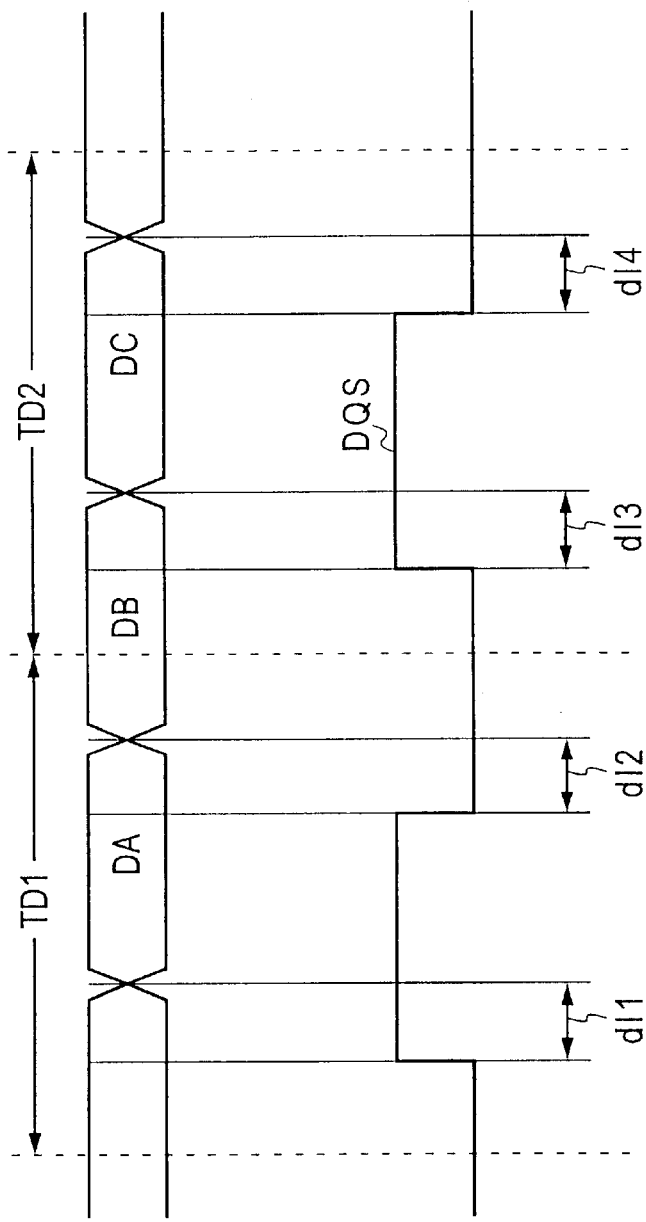
FIG. 2 is a timing chart for explaining the operation of a semiconductor device under test that generates a reference clock in synchronization with data read out therefrom.
Figure 3:
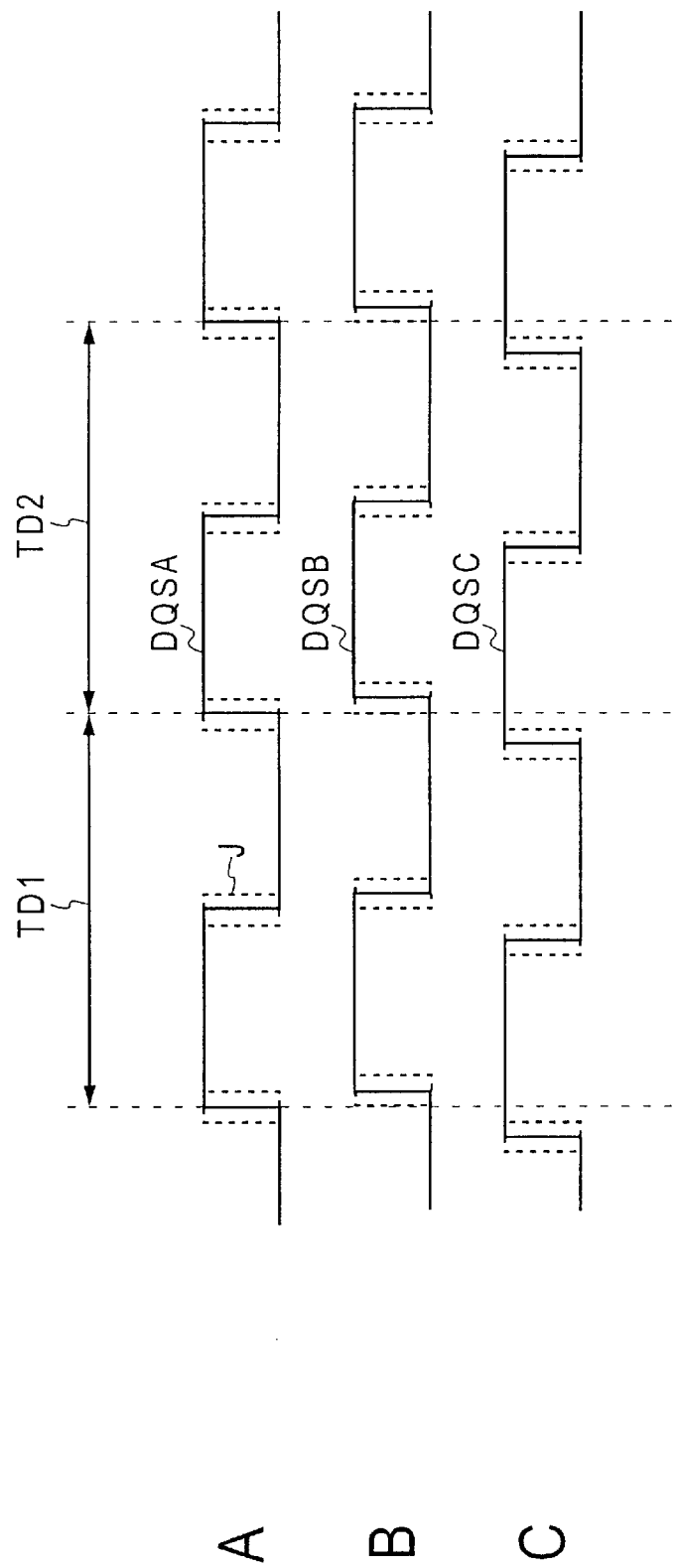
FIG. 3 is a timing chart for explaining how jitter is caused in the reference clock that is output from the semiconductor device.
Figure 4:
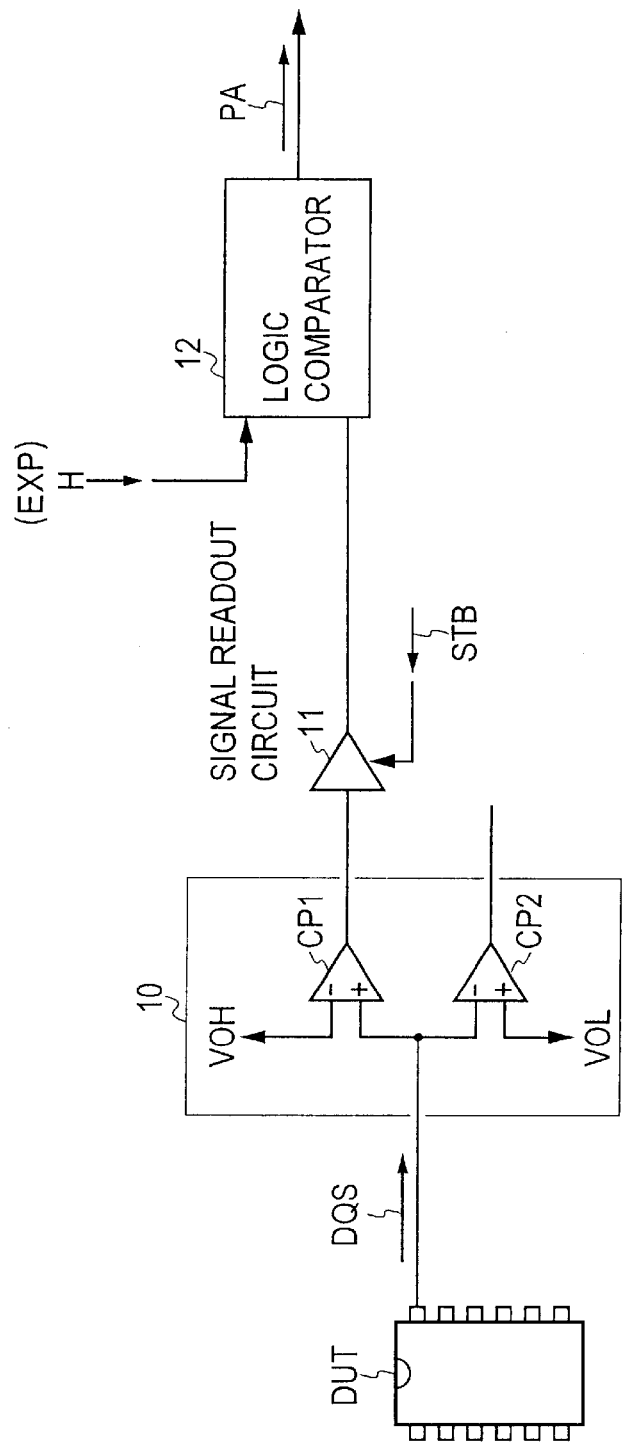
FIG. 4 is a block diagram for explaining a level comparator and a signal readout circuit built in the semiconductor device tester to make a pass/fail decision on a read-out signal from the device under test.
Figure 5:
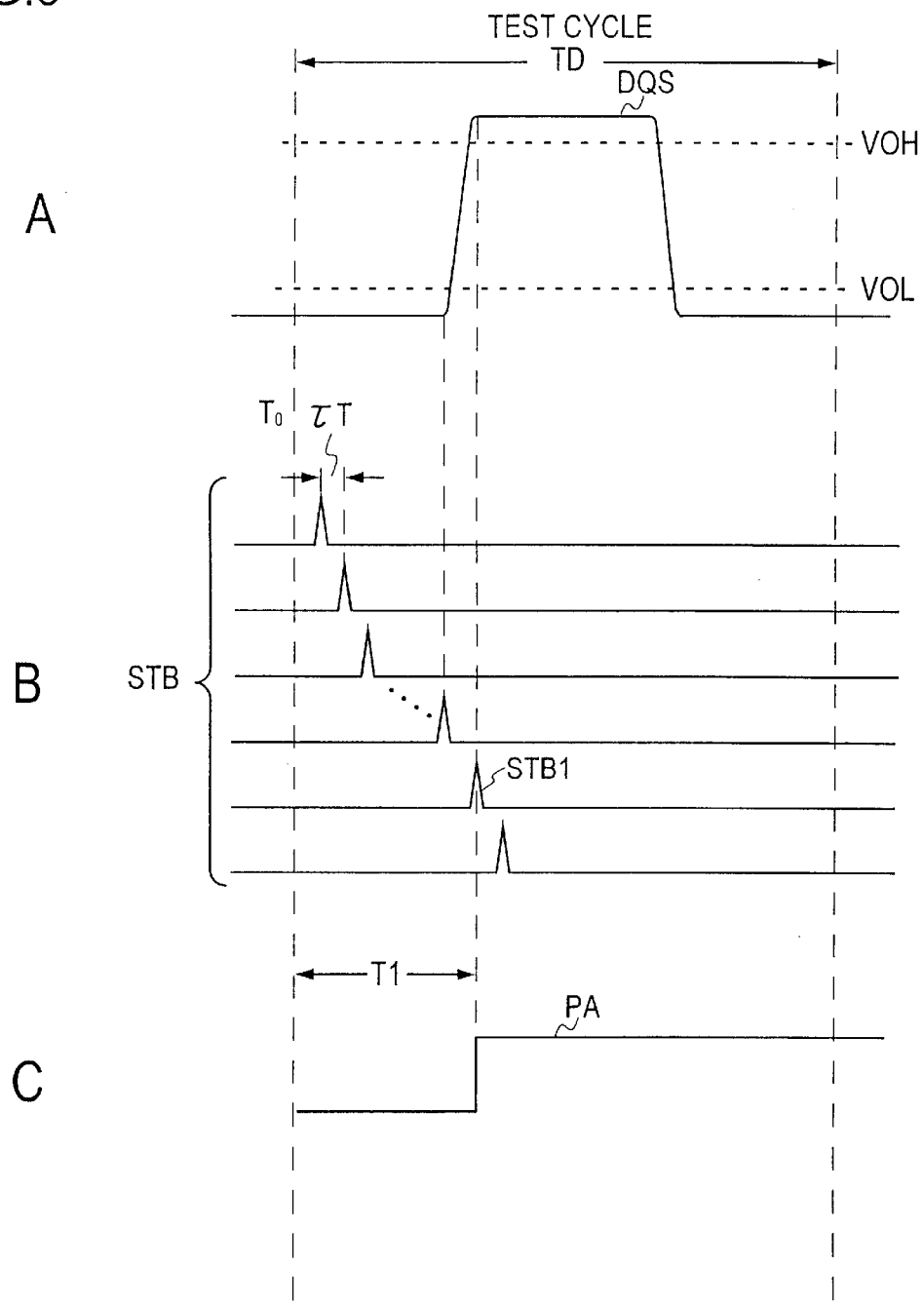
FIG. 5 is a timing chart for explaining how to measure the generation timing of the read-out signal in the conventional semiconductor device tester depicted in FIG. 1.
Figure 6:
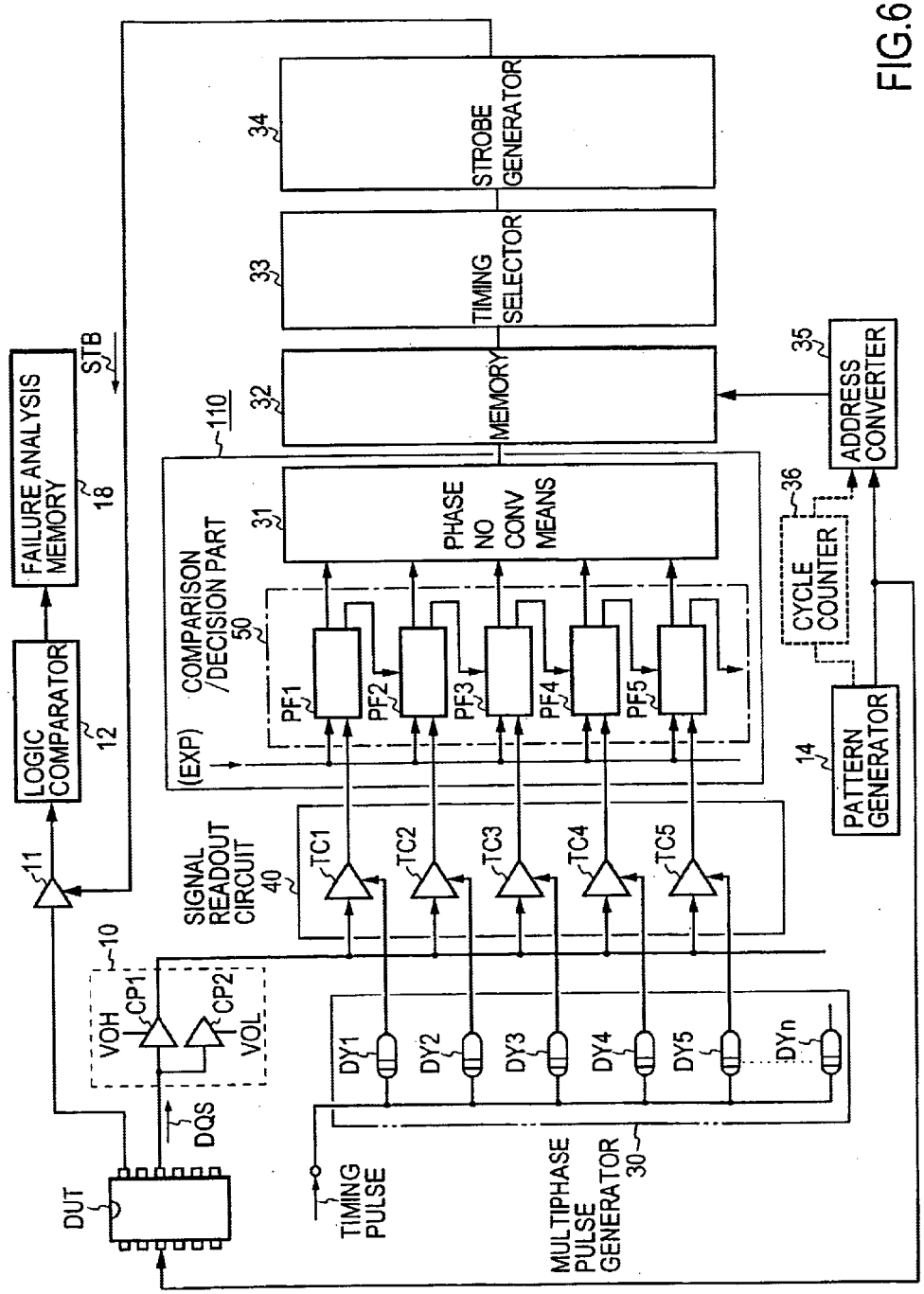
FIG. 6 is a block diagram illustrating the principal part of a tester according to an embodiment of the present invention.

FIG. 6 illustrates in block form the principal part of the semiconductor device tester that embodies the testing method according to the present invention. The semiconductor device tester comprises: a level comparator 10 for making a decision on the logical value of the reference clock DQS output from the semiconductor device DUT; a multiphase generator 30; a plurality of signal readout circuits TC1, TC2, TC3, . . . ; a plurality of comparison/decision means PF1, PF2, PF3, . . . ; phase number converting means 31 by which the points of change of decision results by the comparison/decision means PF1, PF2, PF3, . . . are converted to the phase numbers of multiphase pulses; a memory 32 for storing the phase numbers; a timing selector 33 which, based on the phase number read out of the memory 33, selectively outputs the generation timing of the strobe pulse STB; and a strobe pulse generator 34 for generating the strobe pulse STB at the timing selected by the timing selector 33.

The multiphase pulse generator 30 in this embodiment is shown to be formed by a plurality of delay elements DT1, DY2, DY3, . . . having their delay times set at slightly different values. By providing a time difference of, for example, 100 picoseconds (hereinafter referred to as PS) between the delay times of the delay elements DY1, DY2, DY3, . . . , it is possible to generate pulses at time intervals of 100 PS (which pulses will hereinafter be referred to as multiphase pulses).

FIG. 7A depicts an example of the reference clock DQS in one test cycle TD. As shown in FIG. 7B, the multiphase pulses P1, P2, P3, . . . are displaced, for instance, 100 PS, apart in phase with reference to a predetermined phase position (normally an initial phase position) of the test cycle TD. The multiphase pulses P1, P2, P3, . . . are applied to strobe pulse input terminals of the signal readout circuits TC1, TC2, TC3, . . . , respectively.

To signal input terminals of the signal readout circuit TC1, TC2, TC3, . . . are provided level-comparison results from the level comparator 10. The arrangement shown in FIG. 6 is intended to measure the rise timing of the reference clock DQS. The inputs to the signal readout circuits TC1, TC2, TC3, . . . are sampled by the multiphase pulses P1, P2, P3, . . . Accordingly, the signal readout circuits TC1, TC2, TC3, . . . are supplied, at their signal input terminals, with the output from the voltage comparator CP1 that compares the level of the reference clock DQS with the logical "H" value.

In FIG. 6 there is not shown, for brevity sake, an arrangement for measuring the fall timing of the reference clock DQS, but the arrangement is identical with that for measuring the rise timing of the reference clock DQS, except that the output from the voltage comparator CP2, which compares the level of the reference clock DQS with the logical "L" value, is provided to the signal readout circuits.

Figure 7:
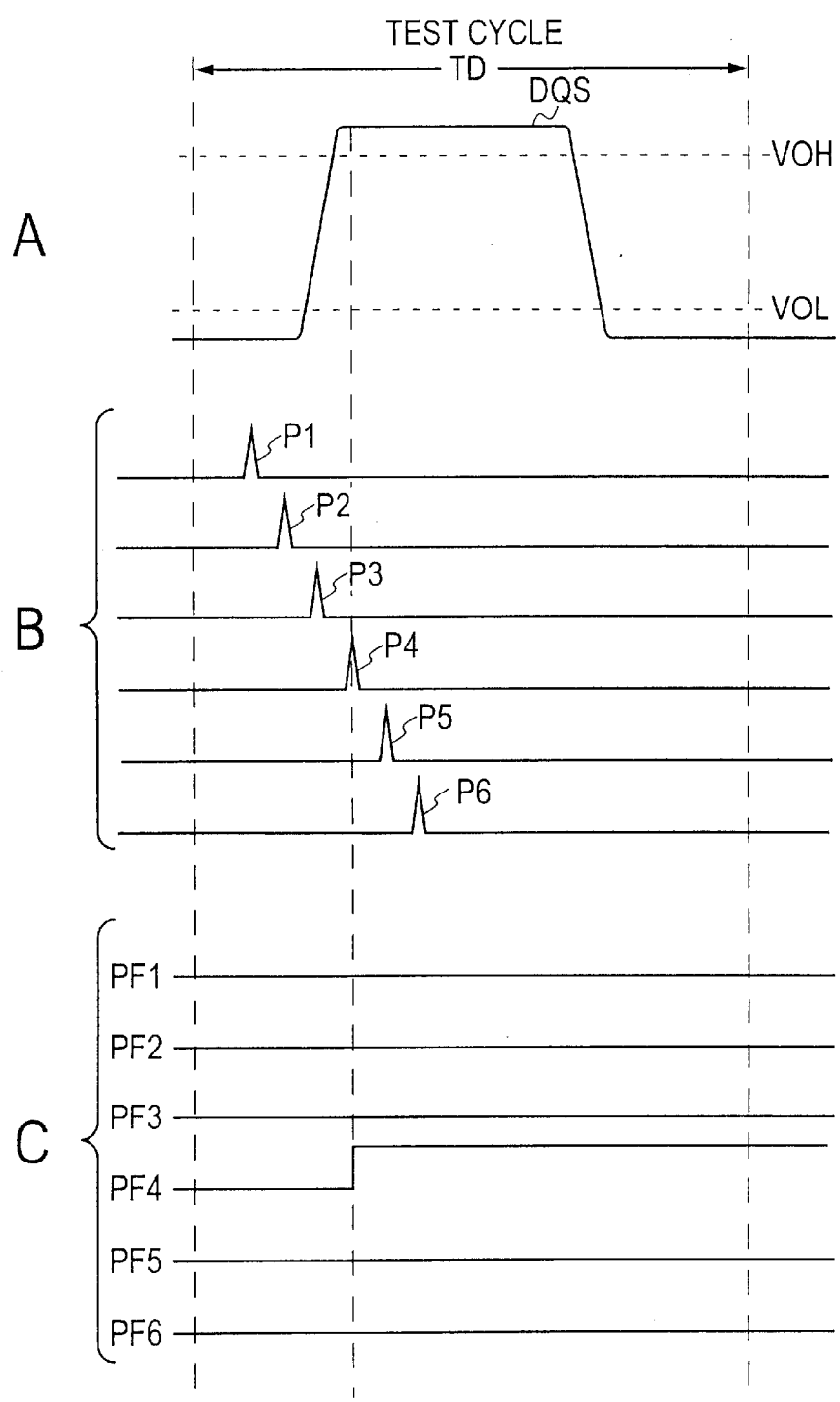
FIG. 7 is a timing chart for explaining the detection of a rising transition point of the reference clock in the tester of FIG. 6.
Figure 8:
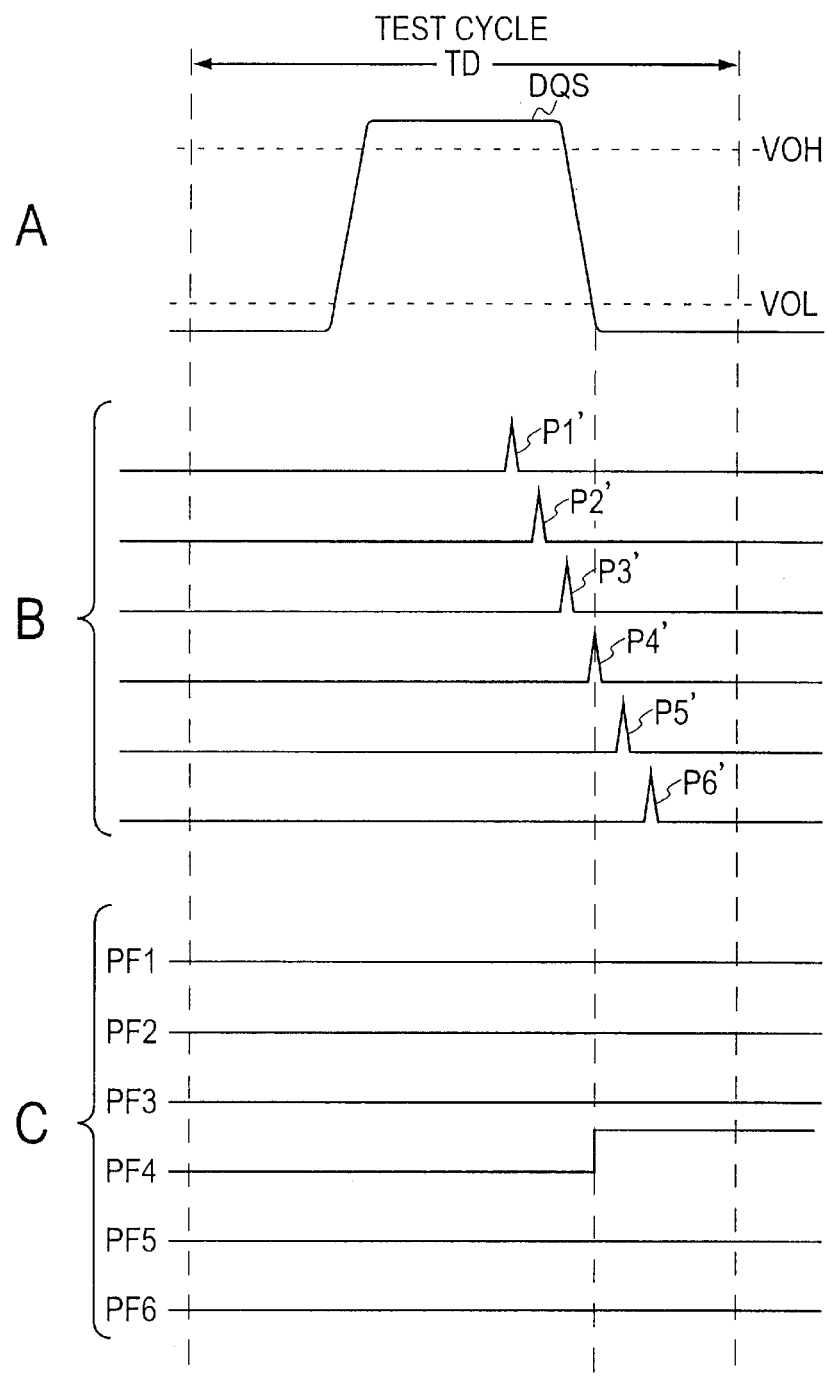
FIG. 8 is a timing chart for explaining the detection of a falling transition point of the reference clock in the tester of FIG. 6.

FIGS. 7 and 8 show how to measure the rise timing and fall timing of the reference clock DQS, respectively. FIGS. 7 and 8 each depict an example of the waveform of the reference clock DQS that is output from a reference clock output pin of the semiconductor device DUT. The voltage comparator CP1 of the level comparator 10 is supplied with the comparison voltage VOH. When the level of the reference clock DQS is higher than the comparison voltage VOH, the voltage comparator CP1 provides the logical "H" value.

Accordingly, when the strobe pulse formed by one of the multiphase pulses is applied to the signal readout circuit after outputting of the logical "H" value from the voltage comparator CP1, the signal readout circuit samples the logical "H" value by the strobe pulse and outputs the sampled logical "H" value. The outputs from the signal readout circuits TC1, TC2, TC3, . . . go to, for example, 0, 0, . . . , 0, 1, 1 . . . The timing at which the sequence of 0's switches to the sequence of 1's is the timing of the sampled output by the strobe pulse immediately following the rise of the reference clock DQS. The outputs from the signal readout circuits TC1, TC2, TC3, . . . each indicate the rise-up phase of the reference clock DQS. The comparison/decision means PF1, PF2, PF3, . . . compare an expected value (in this example, the logical "H" value) and the outputs from the signal readout circuits TC1, TC2, TC3, . . . , and when they match, the comparison/decision means PF1, PF2, PF3, . . . each output the logical "H" value indicating the match.

The comparison/decision means PF1, PF2, PF3, . . . each further make a comparison between the result of its comparison with the expected value and that of the immediately-preceding-stage comparison/decision means to which is provided that one of the multiphase pulses which has a lower phase number. When a mismatch is found between the decision result by the comparison/decision means of the immediately preceding stage and the decision result by its comparison with the expected value, each comparison/decision means decides that the result of its comparison is valid, and outputs a decision result P indicating the validity. In the examples of FIGS. 7 and 8, there is shown the case where the comparison/decision means PF4 output the logical "H" value as the decision result P. When a match is found between the decision result of comparison by the comparison/decision means of the immediately preceding stage and the decision result of its comparison with the expected value, each comparison/decision means outputs the logical "L" value in this example as a decision result F indicating that the result of its comparison is invalid.

Figure 9:
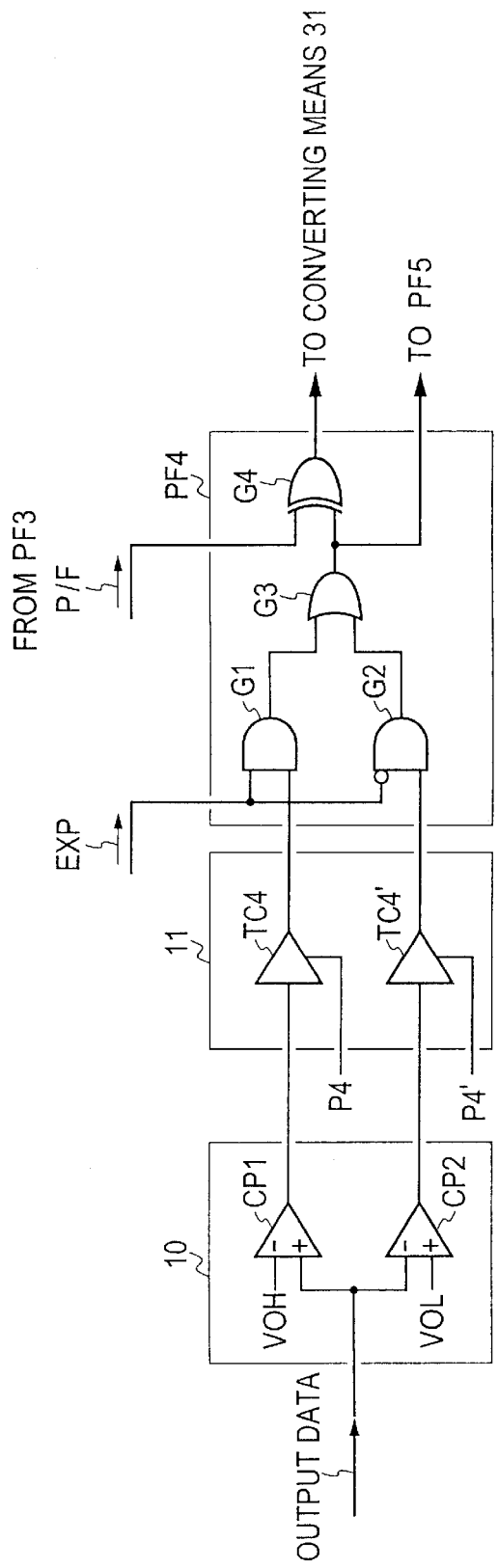
FIG. 9 is a block diagram depicting in block form concrete examples of a level comparator 10, a signal readout circuit 11 and comparison/decision means PF4 built in the tester of FIG. 6.

FIG. 9 illustrates in block form a concrete example of the comparison/decision means PF4, which is shown to be adapted for use as a circuit for measuring the fall timing of the reference clock DQS as well. Accordingly, a signal readout circuit TC4' is connected to the output of the voltage comparator CP2, and the multiphase pulses P4 and P4', shown in FIGS. 7 and 8, are provided as strobe pulses to strobe pulse input terminals of the signal readout circuits TC4 and TC4', respectively.

The comparison/decision means PF4 comprises: gates G1 and G2 for comparing the expected value EXP with the outputs from the signal readout circuits TC4 and TC4', respectively; an OR gate G3 for ORing the outputs from the gates G1 and G2; and a mismatch detecting gate G4 for detecting a mismatch between the output from the OR gate G3 and the decision result by the comparison/decision means PF3 of the immediately preceding stage.

The rise timing of the reference clock DQS can be detected by a route composed of the voltage comparator CP1, the signal readout circuit TC4, the gate G1, the OR gate G3 and the mismatch detecting gate G4. The logical "H" value is provided as the expected value EXP for measuring the rise timing of the reference clock DQS, whereas the logical "L" vale is provided for measuring the fall timing of the reference clock DQS. With the expected value EXP of the logical "H" value set therein, the gate G1 is enabled and monitors whether the output from the signal readout circuit TC4 reverses to the logical "H" value. That is, the expected value EXP is used to determine which of the gates G1 and G2 to enable, thereby selecting the output from the signal readout circuit TC4 for detecting the rise timing or from the signal readout circuit TC4' for detecting the fall timing.

Upon reversal of the output from the signal readout circuit TC4 to the logical "H" value, the output from the gate G1 also reverses to the logical "H" value, which is provided via the OR gate G3 to the mismatch detecting gate G4. The mismatch detecting gate G4 is formed, for instance, by an exclusive OR circuit, to the one input terminal of which is provided the decision result P/F of the comparison/decision means PF3 of the immediately preceding stage.

Only when the decision result P/F of the preceding-stage comparison/decision means PF3 is not the logical "H" value and the output from the signal readout circuit TC4 is the logical "H" value, the mismatch detecting gate G4 outputs the logical "H" value. The output of the logical "H" value is input to the converting means 31 in FIG. 6, while at the same time it is provided to the next-stage comparison/decision means PF5 as well. In the next-stage comparison/decision means PF5 the signal readout circuit TC5 connected thereto outputs the logical "H" value, but since the comparison/decision means PF5 is being supplied with the logical "H" value from the preceding-stage comparison/decision means PF4, the mismatch detecting gate G4 does not output a mismatch detection result but instead provides the logical "L" value indicating the invalidity of the decision result.

With such an arrangement, only that one of the comparison/decision means which is supplied with one of the multiphase pulses for the first time after the level of the reference clock DQS exceeded the comparison voltage VOH set for level comparison outputs the logical "H" value (valid P). Incidentally, the mismatch detecting gate G4 of the first-stage comparison/decision means PF1 is supplied with the logical "L" value as the preceding-stage decision result. Consequently, when the signal readout circuit TC1 connected thereto the logical "H" value, the comparison/decision means PF1 outputs a mismatch detection signal of the logical "H" value, detecting that the reference clock DQS has risen up at the beginning of the test cycle TD.

The phase number converting means 31 in FIG. 6 reads therein the outputs from the comparison/decision means PF1, PF2, PF3, ..., and converts the number corresponding to the phase number of the comparison/decision means that provided the "valid P" output to data of the smallest possible number of bits. That is, in this embodiment the phase number converting means 31 outputs data indicating the phase numbers of the multiphase pulses that caused the outputs from the signal readout circuits to make "valid P" the pass/fail results of the comparison/decision means PF1, PF2, PF3, ....

Figure 10:
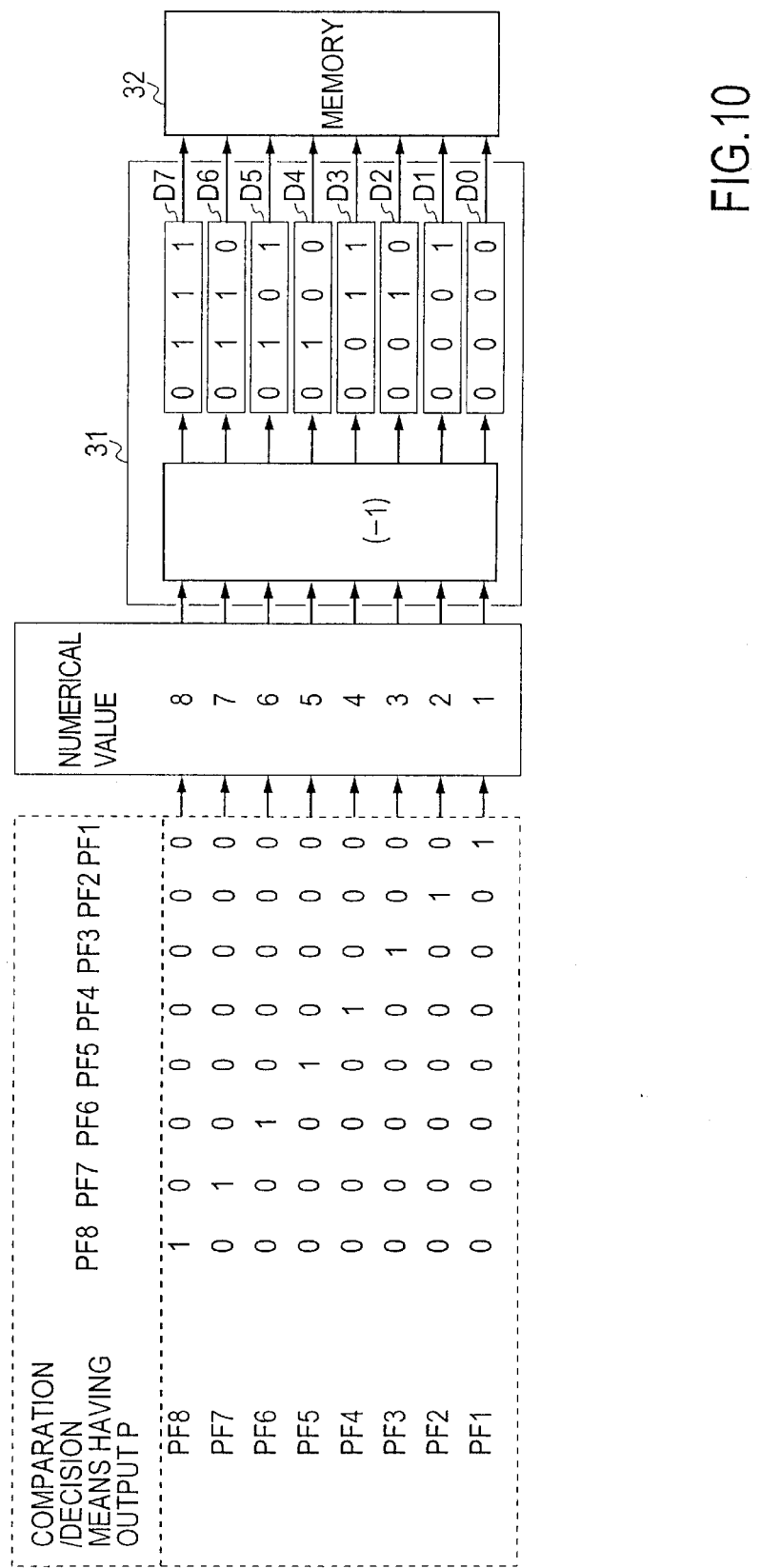
FIG. 10 is a diagram for explaining the operation of phase number converting means 31 in FIG. 6.

FIG. 10 shows a conversion algorithm of the converting means 31. It is desirable the numbers of signal readout circuits TC and comparison/decision means PF be large enough to set the strobe pulse interval that provides the accuracy of measurement which sufficiently meets the specifications of the device under test. This example is shown to have eight comparison/decision means PF1 to PF8. In the broken-lined frame in FIG. 10 there are shown the output states (the "valid P" output being indicated by 1 and the "invalid F" output by 0) of the comparison/decision means PF1 to PF8 when each of them provides the "valid P" output. For example, when the comparison/decision means PF8 yields the "valid P" output, the other comparison/decision means PF7 to PF1 all output "0s" as shown in the column PF8. Similarly, when the comparison/decision means PF7 yields the "valid P" output, the other comparison/decision means PF8 and PF6 to PF1 all output "0s" as shown in the column PF7. When any one of the eight comparison/decision means PF8 to PF1 outputs the logical "H" value, the position of "1" in the "0, 1" column of the outputs from the comparison/decision means PF8 to PF1 is represented by one of numerical values 1 to 8, then a number "1" is subtracted from that numerical value, and the subtracted value is converted to a corresponding one of eight pieces of numeric data D0 to D7 which are four-bit in the illustrated example. The pieces of four-bit numeric data D0 to D7 can be handled as the numbers representing the phase sequence of the multiphase pulses P1 to P8. With the use of four bits, the outputs from the eight comparison/decision means PF1 to PF8 can be converted to 16 phase numbers 0 to 15, which are stored in the memory 32. In practice, four-bit registers are connected to the outputs of the comparison/decision means PF1 to PF8 and the eight pieces of numeric data D0 to D8 are prestored in the registers so that the four-bit numeric data is read out of the register connected to that one of the comparison/decision means PF1 to PF8 which output the logical "H" value.

The comparison/decision means 50 and the phase number converting means 31 constitute phase number output means 110 that reads thereinto the output from the signal readout circuit 40 and outputs the phase number of the strobe pulse immediately following the point of change (rise or fall) of the reference clock DQS.

Figure 21:
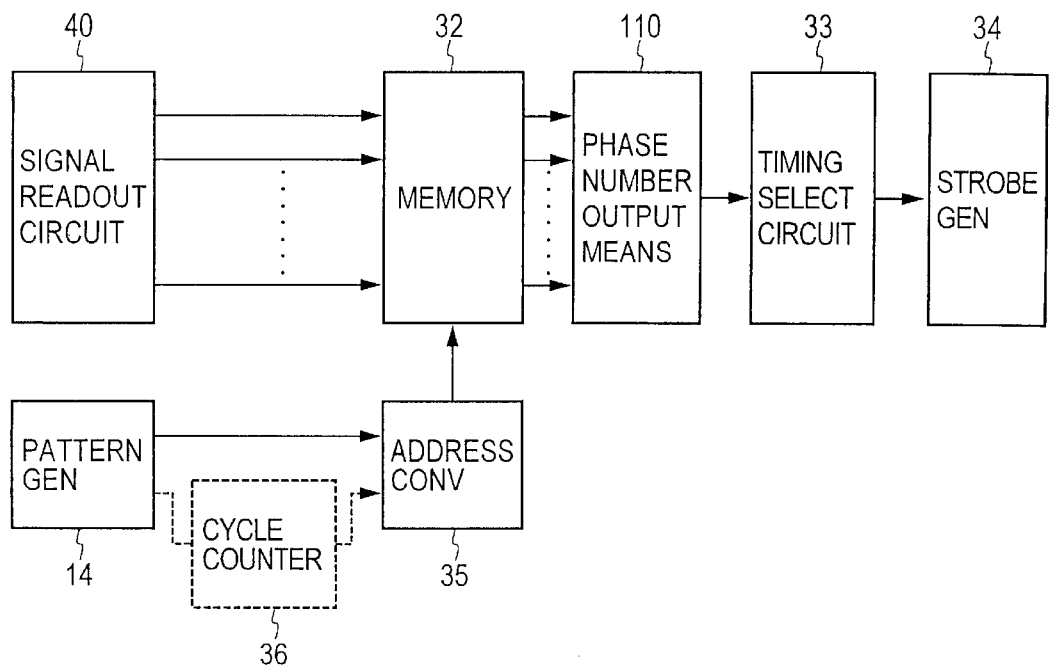
FIG. 21 is a lock diagram illustrating a modified form of the FIG. 6 embodiment.

By converting the decision result of, for instance, eight bits to the four-bit phase number data as mentioned above, the storage capacity of the memory 32 can be reduced. It is also possible to employ such an arrangement as depicted in FIG. 21 in which the output (eight-bit in the FIG. 10 example) from the signal readout circuit 40 is stored in the memory 32 and the output of the signal readout circuit 40 read out of the memory 32 is converted by the phase number output means 110 to the corresponding phase number. In this instance, however, the storage capacity of the memory 32 needs to be larger than in the case of FIG. 6.

In the embodiment of FIG. 6, X and Y addresses to be provided to the semiconductor device DUT from the pattern generator 14 are converted by an address converter 35 to adequate addresses (suitable for the application to the memory 32), and each measured value is stored in the memory 32 at an address corresponding to the address to be fed to the semiconductor device DUT. Accordingly, the memory 32 is assumed to have the entire address space corresponding to the addresses of the semiconductor device DUT that are to be tested, that is, the addresses to be tested. The memory 32 may also be provided utilizing an unused storage area of a memory employed for a different purpose.

Prior to testing the semiconductor device DUT, writing and reading to and from all of its addresses are carried out, then the rise and fall timing of the reference clock DQS, which is output during the reading, is measured for each address provided to the device DUT, and the phase numbers of the multiphase pulses obtained as the measurement results are stored in the memory 32. For the measurement of the fall timing of the reference clock DQS, the route composed of the voltage comparator CP2, the signal readout circuit TC'4 and the gates G2, G3 and G4 is enabled by providing the logical "L" value as the expected value EXP to the gates G1 and G2 in FIG. 9. As will be understood from the description given previously in respect of FIG. 8, the fall timing of the reference clock DQS is provided as the corresponding phase number data.

The rise and fall timing of the reference clock DQS is measured as referred to above and the measured results are written in the memory 32, followed by testing the semiconductor device DUT.

In the testing of the semiconductor device DUT, an address contained in the test pattern generated by the pattern generator 14 in FIG. 6 is provided to the device DUT and data is read out of its corresponding address, while at the same time the measurement results (the phase numbers of the multiphase pulses) corresponding to the rise and fall timing of the reference clock DQS output from that address when an access was made thereto previously are read out of the memory 32. The thus read-out measurement result is fed to the timing selector 33, which selects the timing for the application of the strobe pulse STB to the signal readout circuit 11 for reading the data that is read out of the device DUT.

Figure 11:
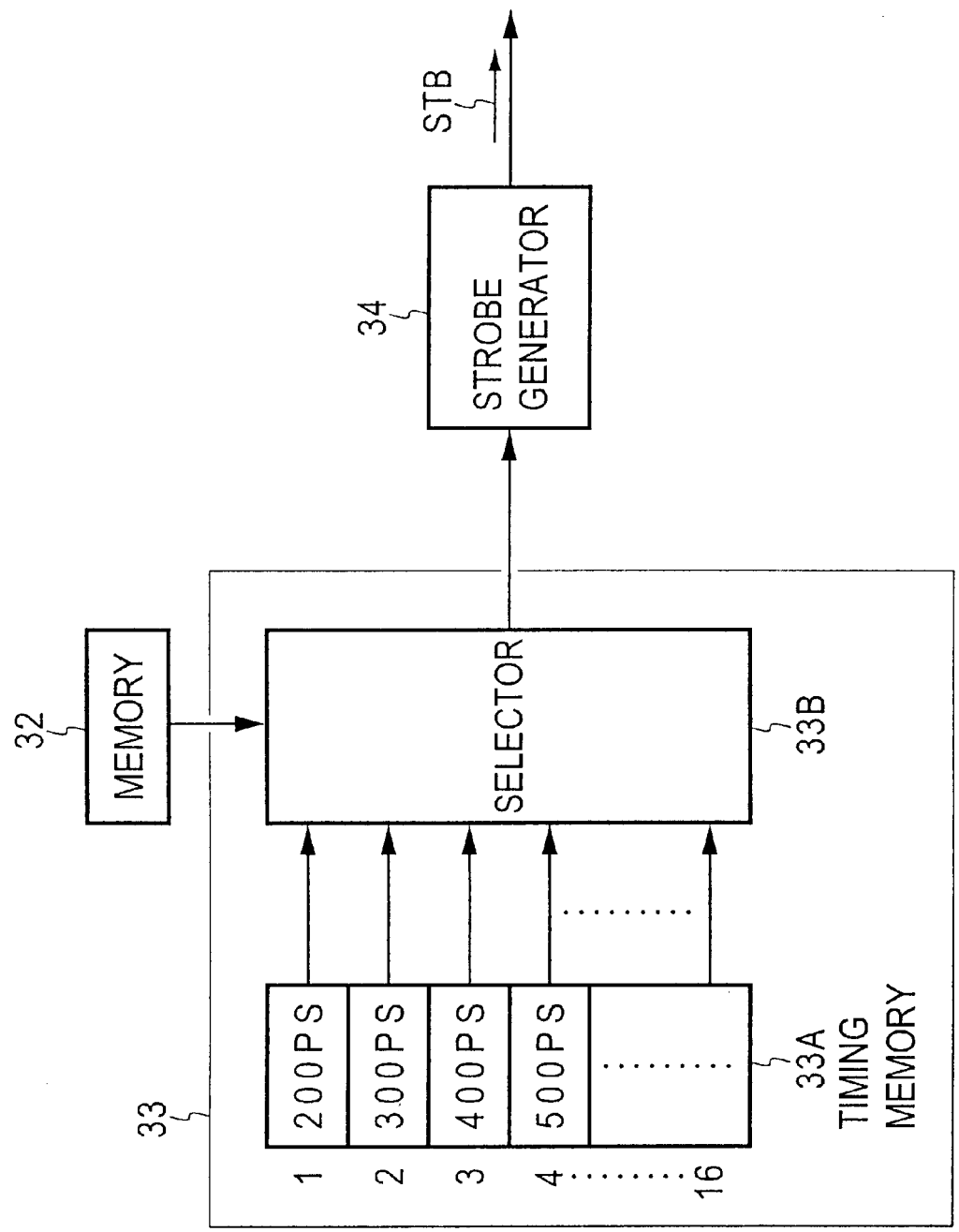
FIG. 11 is a block diagram depicting a concrete example of a timing selector 33 in FIG. 6.

FIG. 11 depicts the general outlines of the timing selector 33 in FIG. 6. The timing selector 33 comprises a timing memory 33A in which there are stored the values of timing for generation of the strobe pulse STB, and a selector 33B that selects any one of the generation timing values in the timing memory 33A in accordance with the measurement result read out of the memory 32.

In the timing memory 33A there are stored 16 kinds of time values such as 200 PS, 300 PS, 400 PS, 500 PS, . . . The time values each correspond to the time relative to the initial phase position of the test cycle TD, and indicate the measured rise or fall timing of the reference clock DQS. The timing indicated by this time value is used as the reference phase position for measuring each of the time intervals dI1, dI2, dI3, . . . between it and the points of change of data. One of the time values is selected according to the measurement result read in the memory 32, and the selected time value is input to the strobe generator 34.

In the strobe generator 34 the time (an intended value) to the point of change of data to be read out of the device DUT is added to or subtracted from the time value fed from the timing selector 33. The strobe pulse generator 34 generates the strobe pulse STB at the timing thus calculated, and applies it to the signal readout circuit 11 (FIG. 6) to cause it to read the data read out of the device DUT, making a check to see if the point of change of data is actually present at the timing of the strobe pulse STB.

That is, a designer of the semiconductor device grasps in advance, as a design value, the time interval between the rise or fall timing of the reference clock DQS and the point of change of the data that is read out of the semiconductor device. Accordingly, if the rise and fall timing of the reference clock DQS is premeasured and hence made known, an accurate test can be achieved by making a check for the presence of the point of change of data in a predetermined range of time based on the known fall and rise timing of the reference clock DQS.

While the above embodiment has been described to measure the rise or fall timing of the reference clock DQS for every address of the semiconductor device under test, the present invention is applicable as well to the case of testing the semiconductor device, taking into account gradual variations in the rise or fall timing of the reference clock DQS which are caused, for example, by a temperature rise of the semiconductor device due to an extended period of its operation.

In this instance, as indicated by the broken lines in FIG. 6, a cycle counter 36 is provided to count cycle numbers of the test pattern generated by the pattern generator 14. The count value of the cycle counter 34, which indicates the current cycle of the test pattern, is converted by an address converter 35 to an address signal for access to the memory 32.

Prior to the test, in every readout mode during the generation of all test patterns the rise or fall timing of each reference clock, which is output from the semiconductor device under test is measured in the same manner as described previously, and the measured results are stored in the memory 32. The test is started after measuring the rise or fall timing of the reference clock DQS for every test pattern. In the test the measured result on the rise or fall timing of the reference clock DQS is read out of the memory 32 and is used to determine the generation timing of the strobe pulse STB for reading the data that is read out of the device under test. Thus, even if the timing of the reference clock DQS gradually varies with the lapse of time, the data readout timing also varies correspondingly; so that it is possible to conduct the test taking into account the jitter o drift of the rise or fall of the reference clock DQS that is caused by a temperature rise of the device under test.

Figure 12:
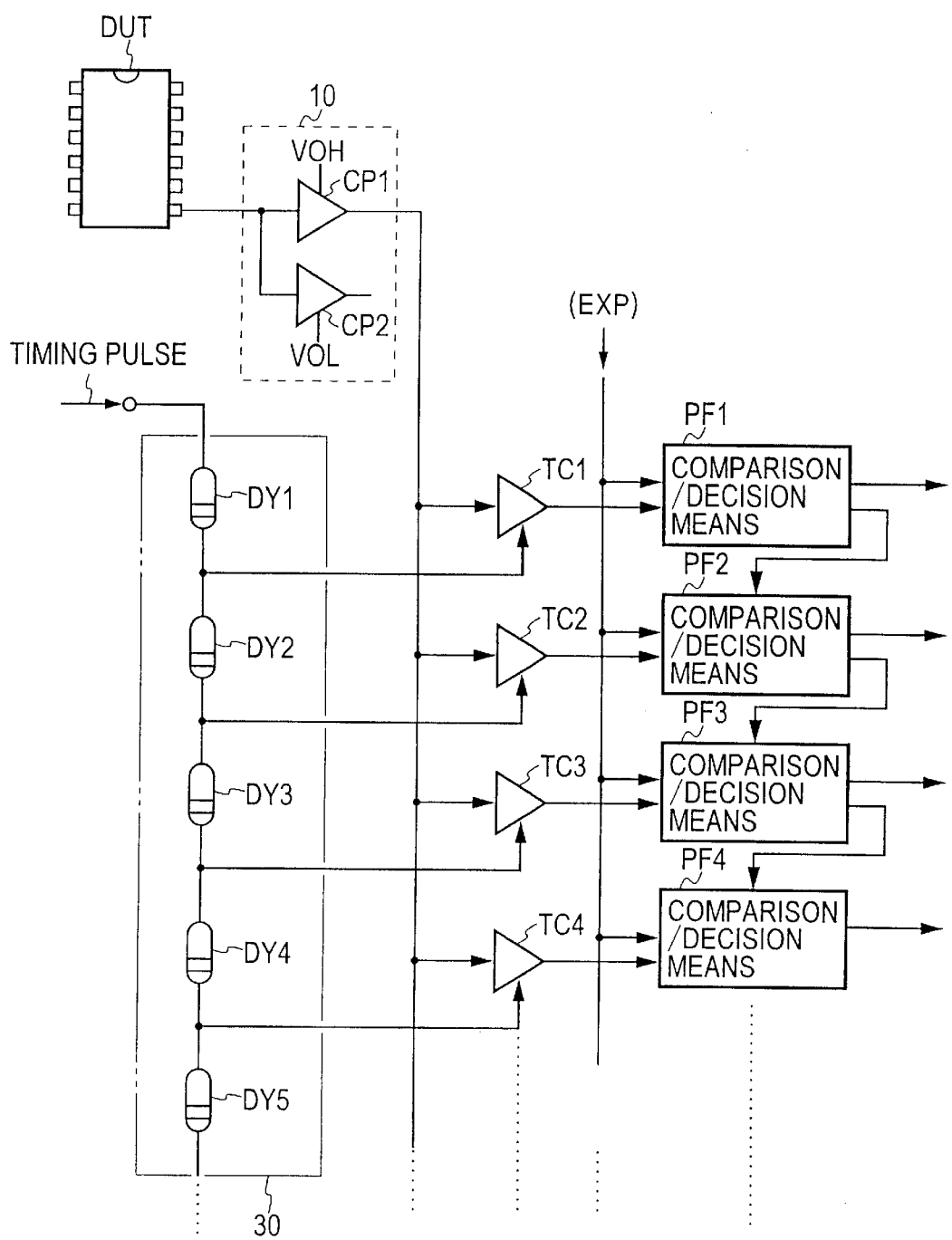
FIG. 12 is a block diagram showing a modified form of a multiphase pulse generator 30 in FIG. 6.

FIG. 12 illustrates in block form a modified form of the multiphase pulse generator 30. In this embodiment delay elements DY1, DY2, DY3, . . . which have the same but short delay time as of 100 PS (picoseconds) are connected in cascade so that slightly phased-apart multiphase pulses are provided from between the stages of the cascade-connected delay elements DY1, DY2, DY3, . . . .

As described above, according to the present invention, for each test cycle the phase of the point of change of the reference clock is measured for every address to be tested and is prestored in the memory 32, and in each test cycle the phase difference between the rise or fall timing of the reference clock and the point of change of the output data from the device under test is determined based on the phase read out of the memory 32—this ensures correctly testing the semiconductor device and excludes the possibility of rejecting a nondefective or normal semiconductor device as being defective.

Moreover, according to the present invention, since the rise or fall timing of the reference clock DQS is measured in one test cycle by using the multiphase pulses P1, P2, P3, P4, P5, . . . and P1', P2', P3', P4', P5', . . . depicted in FIGS. 7 and 8, it can be measured in a far shorter time than in the past. As a result, the semiconductor device of this kind can be tested in a short time and with high accuracy, and the operational efficiency of the testing apparatus can be increased accordingly.

Furthermore, since the measurement results on the rise or fall timing of the reference clock are converted to the phase numbers of the multiphase pulses, the number of bits of data can be made small. This permits reduction of the storage capacity of the memory 32, keeping extra costs for the addition of this circuit down to a minimum.

Figure 13:
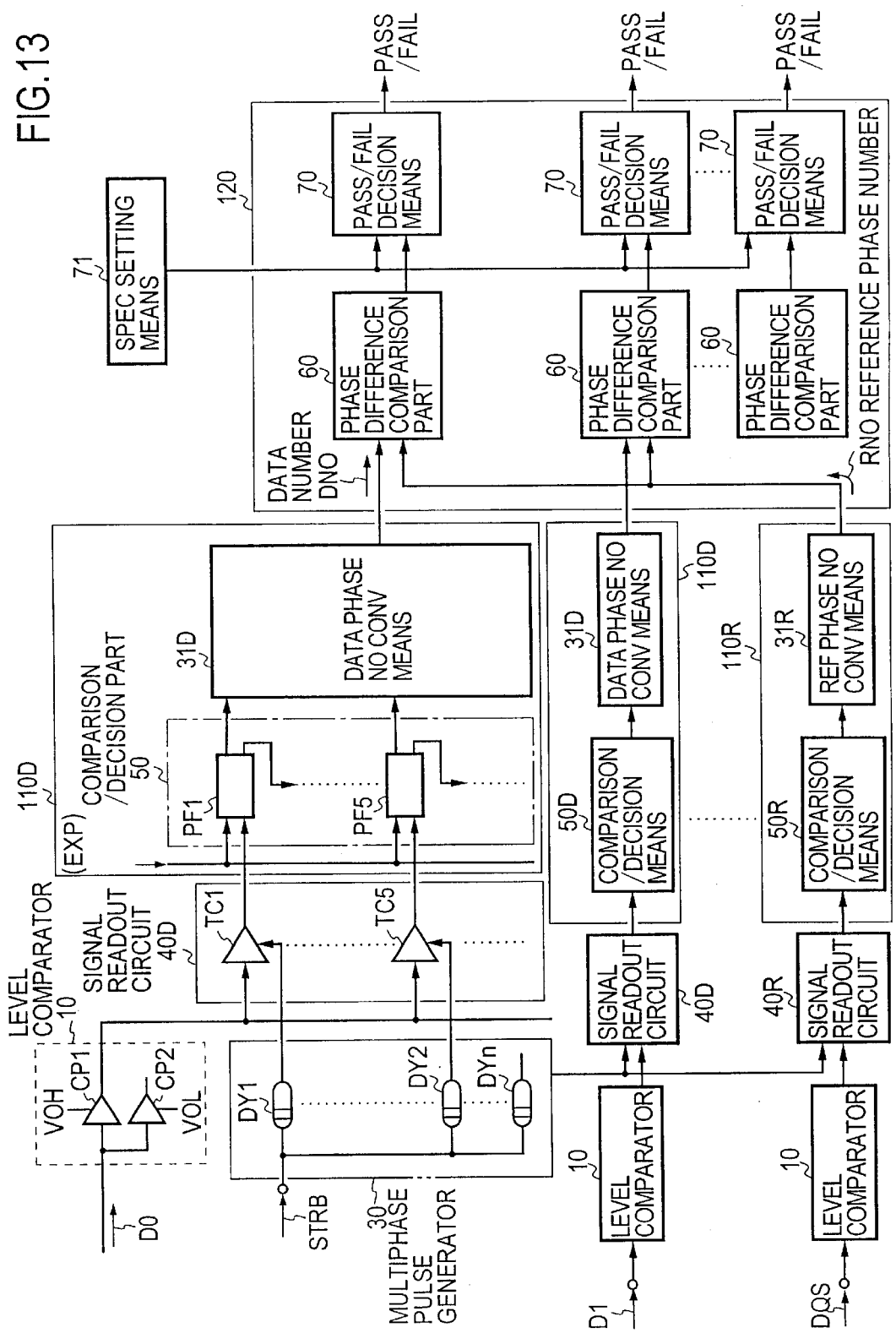
FIG. 13 is a block diagram illustrating the principal part of another embodiment of the present invention.

Next, a description will be given, with reference to FIG. 13, of a second embodiment of the present invention that permits further reduction of the time for test. In FIG. 13 the parts corresponding to those in FIG. 6 are identified by the same reference numerals. In this embodiment the pieces of data D0, D1, . . . output from the semiconductor device under test are level-compared with the reference clock DQS by level comparators 10D, 10D, . . . and 10R, respectively. The comparison results are provided to signal readout circuits 40D, 40D, ... and 40R, and the rise or fall time of all the pieces of data D0, D1, ... as well as the rise or fall time of the reference clock DQS are measured by the strobe pulses STB formed by the multiphase pulses generated by the multiphase generator 30. The level comparators 10D and 10R, the signal readout circuit 40D and 40R, and the comparison/decision means 50D and 50R are identical in construction with the level comparator 10, the signal readout circuit 40 and the comparison/decision part 50 in FIG. 6, respectively. This embodiment will be described in connection with the case of detecting the rise timing of the reference clock DQS and the data D0, D1, ... as described previously with respect to FIG. 7.

The outputs from the signal readout circuits 40D and 40R are fed to the comparison/decision means 50D and 50R, which decide the phases of those of the multiphase pulses that immediately followed the rises of the pieces of data D0, D1, ... and all reference clock pulses DQS.

The comparison/decision means 50D and 50R perform the same deciding operation as described previously in respect of FIG. 9. That is, only the comparison/decision means PF, which corresponds to the phase of the strobe pulse that immediately followed the rise of the data from the device under test or reference clock, outputs the logical "H" value 1, and the other comparison/decision means PF all output the logical "L" value 0.

Upon decision of the phases of the strobe pulses that immediately followed the rise of the pieces of data D0, D1, ... and the reference clock pulses DQS, the comparison/decision means 50D and 50R provide the decision results to data phase number converting means 31D and reference phase number converting means 31R, by which the positions of 1s in the decision results are converted to a data phase number DNO and a reference phase number RNO, respectively.

Figure 14:
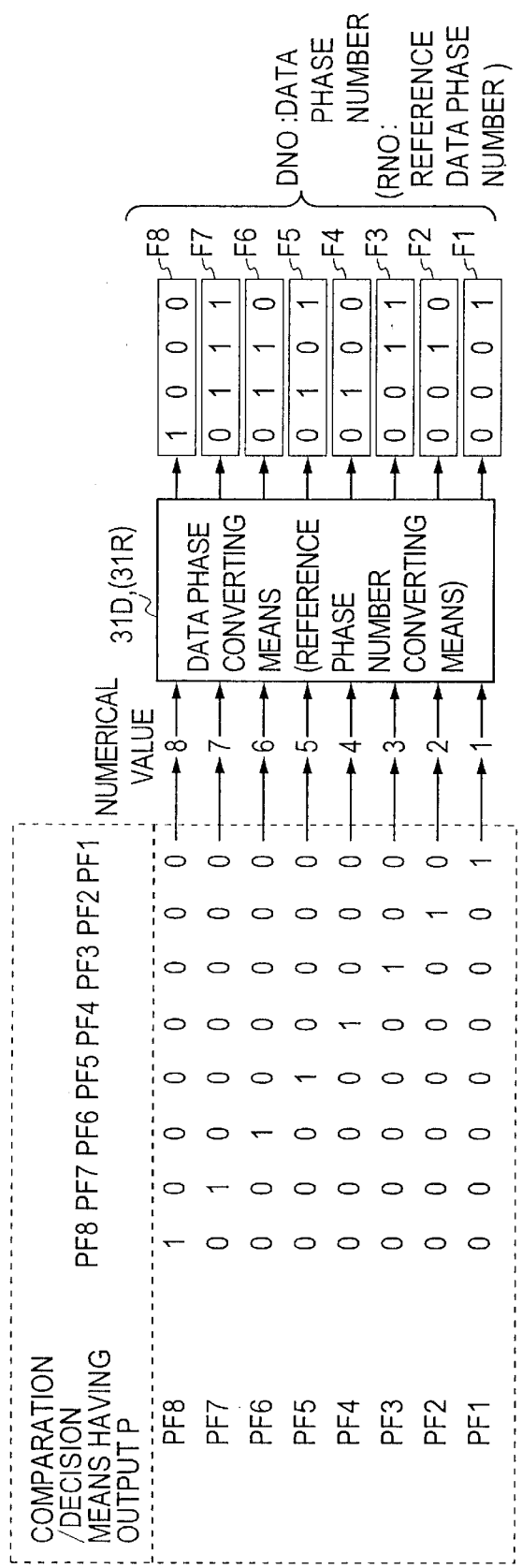
FIG. 14 is a diagram for explaining the operation of phase number converting means 31D in FIG. 13.

FIG. 14 shows the conversion algorithm of the phase number converting means 31D (31R), which is about the same as the algorithm depicted in FIG. 10. In FIG. 14, however, the numerical value indicating the position of "1" in the 0, 1 column of the outputs from the comparison/decision means PF1 to PF8 is converted to a corresponding one of the pieces of numeric data F1 to F8 without being subtracted by 1, and the converted numeric data is output as the data phase number DNO. Similarly, the reference phase number converting means 31R also converts the numerical value indicating the position of "1" in the 1, 0 column of the outputs from the comparison/decision means 50R to the corresponding numeric data and outputs it as the reference phase number RNO. This can be done by using such an arrangement as referred to previously with reference to FIG. 10; that is, a register in which there are stored the phase numbers corresponding to the respective pieces of numeric data F1, F2, ... is connected to the output side of each of the comparison/decision means for the output data PF and the comparison/decision means for the reference clock PF, and the phase number is output from the register connected to the comparison/decision means PF having output the logical value 1.

The data phase number DNO converted by the data phase number converting means 31D and the reference phase number RNO by the reference phase number converting means represent the phases that define the rise timing of each of the pieces of data D0, D2, D3, ... and the rise timing of the reference clock DQS. These phase numbers DNO, ... and RNO are phase-compared by phase comparison parts 60.

Figure 15:
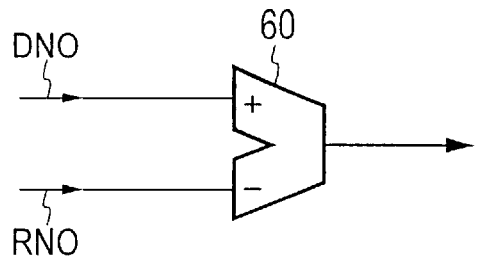
FIG. 15 is a block diagram depicting a concrete example of each phase comparison part 60 in FIG. 13.

FIG. 15 depicts a concrete example of the phase comparison part 60, which is formed by a digital subtractor and in which the data phase number DNO is input to a plus input terminal of the subtractor and the reference phase number RNO to its minus input terminal.

Figure 16:
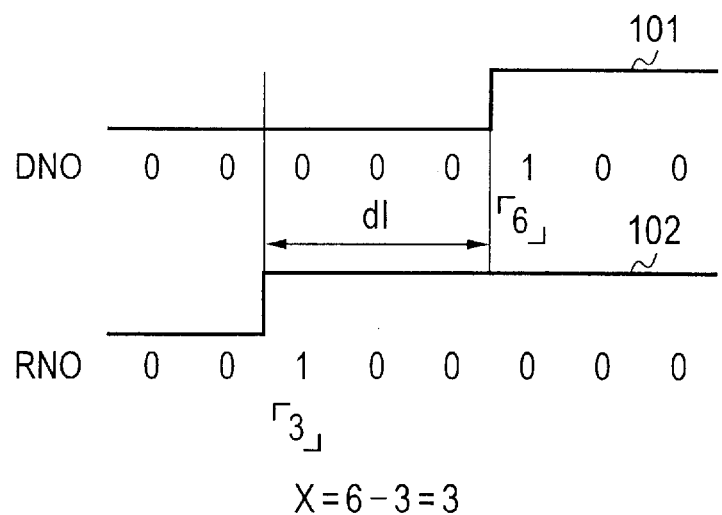
FIG. 16 is a timing chart for explaining the operation of the phase comparison part 60 shown in FIG. 15.

Accordingly, for example, when the data phase number DNO is "6" and the reference phase number RNO is "3" as shown in FIG. 16, the phase comparison part 60 outputs X=6−3=3. Thus the phase difference d1 between the leading edges of a data waveform 101 and a reference clock waveform 102 is obtained. In FIG. 16 there are depicted 0, 1 arrays of decision outputs corresponding to the data phase number DNO=6 and the reference phase number RNO=3, respectively; the arrays are equivalent to the columns in FIG. 14 corresponding to them.

Figure 17:
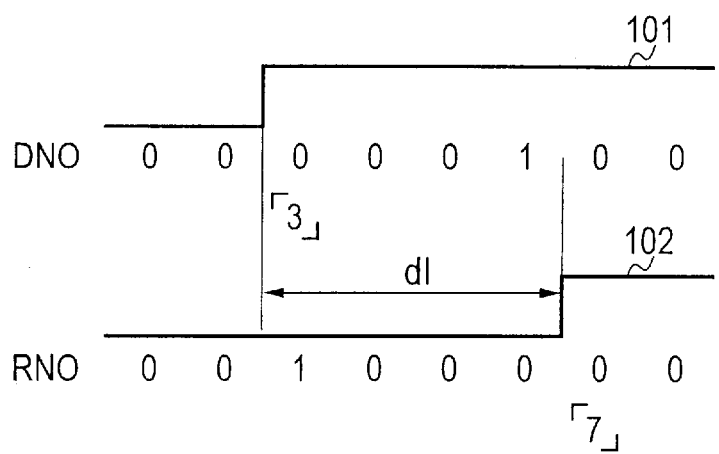
FIG. 17 is another timing chart for explaining the operation of the phase difference detecting part 60 in FIG. 15.

When the data phase number DNO is "3" and the reference phase number RNO is "7" as shown in FIG. 17, the phase comparison part 60 outputs X=3−7=−4.

Figure 18:
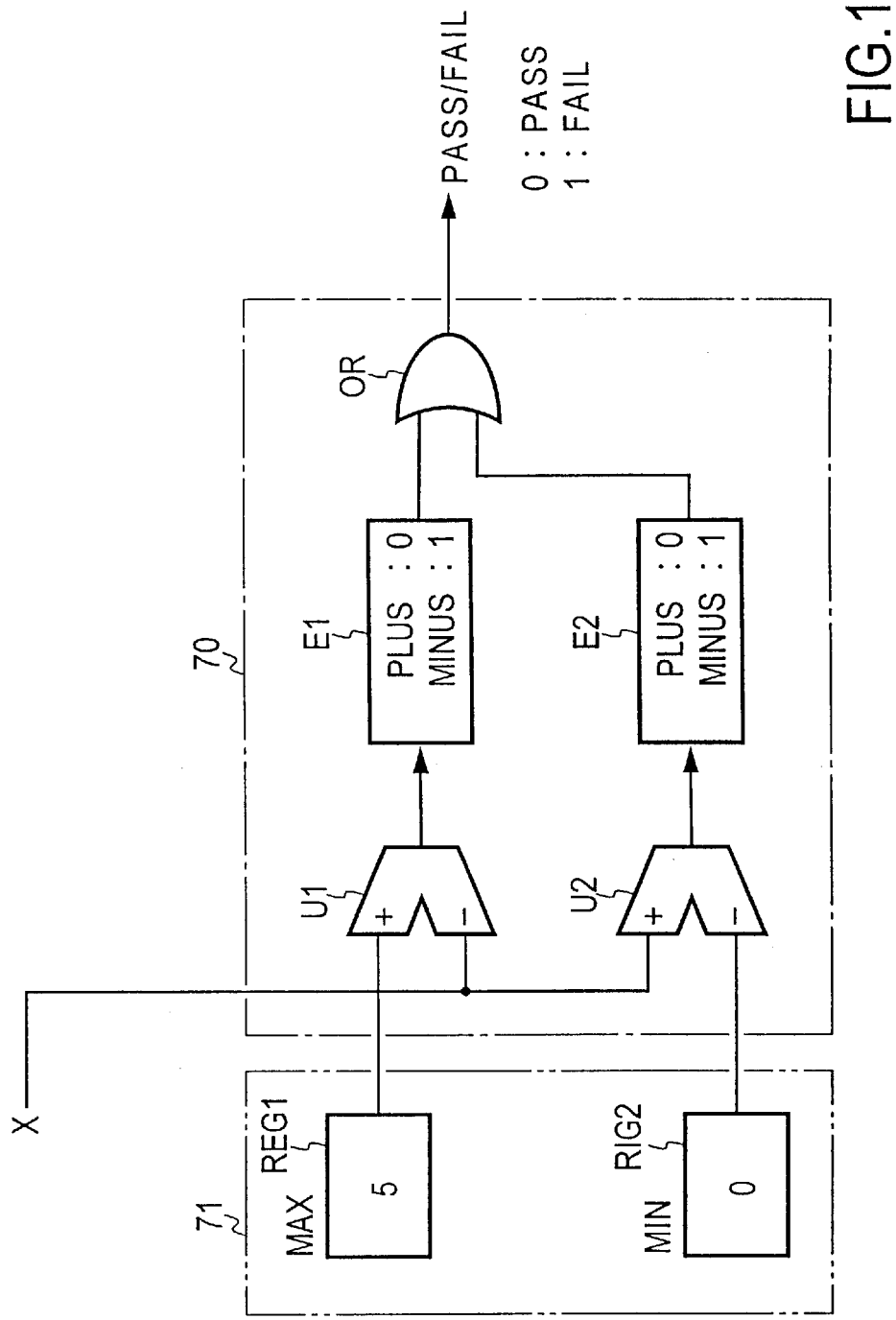
FIG. 18 is a block diagram depicting a concrete example of pass/fail decision means 70 in FIG. 13.

FIG. 18 depicts, by way of example, pass/fail decision means 70 and spec setting means 71. The spec setting means 71 comprises registers REG1 and REG2, in which a user sets spec values that meet the specifications of the semiconductor device under test. In this example, the registers REG1 and REG2 are shown to have set therein "5" and "0" respectively.

The pass/fail decision means 70 is formed, in this example, by two subtractors U1 and U2, two encoders E1 and W2, and an OR gate OR. The output X from the phase comparison part 60 is provided to a minus input terminal of the subtractor U1 and a plus input terminal of the subtractor U2; the value "5" set in the register REG1 of the spec setting means 71 is provided to a plus input terminal of the subtractor U1; and the value "0" set in the register REG2 is provided to a minus input terminal of the subtractor U2.

The encoders E1 and E2 output a logical value 0 or 1, depending on whether the outputs from the subtractors U1 and U2 are plus or minus.

The OR gate OR calculates the logical OR of the outputs from the encoders E1 and E2, and outputs a pass/fail result PASS/FAIL. The device under test is decided to be nondefective or defective, depending on whether the output from the OR gate OR is 1 or 0.

Accordingly, in the case of FIG. 16, since X=3, the output from the subtractor U1 is 5−(−4)=9 and the output from the subtractor U2 is 3−0=3; so that the outputs from the encoders E1 and E2 are both 0s, and the OR gate OR outputs PASS.

On the other hand, in the case of FIG. 17, since X=−4, the output from the subtractor U1 is 5−(−4)=9 and the output from the subtractor U2 is −4−0=−4, so that the output from the encoder E1 is 0 but the output from the encoder E2 is 1, and the decision output from the OR gate OR is 1, that is, FAIL.

That is, this example is set such that the device under test is decided as being defective when the phase of the reference clock DQS lags behind the phase of the phase of the data output from the device under test. The phase comparison parts 60 and the pass/fail decision means 70 constitute a pass/fail result output part 120.

The decision output from each pass/fail decision means 70 varies with the value that is set in the spec setting means 71, but the decision output is modified according to the user's requirements.

Figure 19:
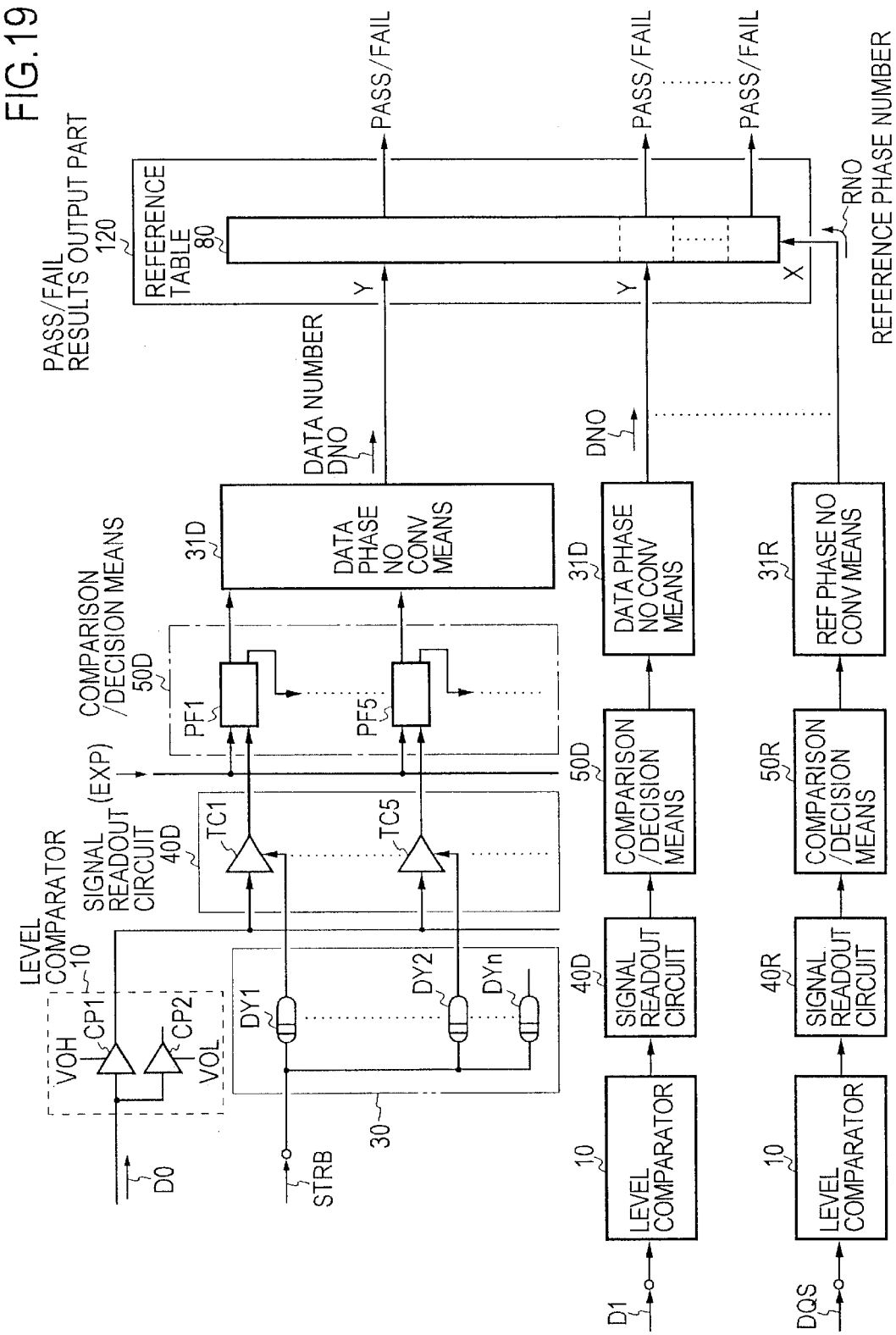
FIG. 19 is a block diagram illustrating the principal part of still another embodiment of the present invention.

FIG. 19 illustrates in block form a third embodiment of the present invention. In this embodiment a reference table 80 formed by a memory is provided, as the pass/fail result output part 120, at the stage following each data phase number converting means 31D so that the pass/fail result PASS/FAIL is output directly from the reference table 80.

In this example, the reference phase number RNO is input to the X-address of the memory forming each reference table 80 and the data phase number DNO is input to the Y-address of the memory corresponding to the data phase number converting means 31D from which the data phase number DNO is output.

FIG. 20A is a table showing values of the differences between the data phase numbers DNO and the reference phase numbers RNO. When the user intends to decide that the values from −2 to +2 indicate PASS, P (=0) representing PASS is stored in memory cells of the reference table 80 where the values are in the range of −2 to +2 and F (=1) representing FAIL is stored in the other memory cells as depicted in FIG. 20B.

By applying the reference phase number RNO to the X-address and the data phase number DNO to the Y-address, P (=0) is read out of the reference table 80 for the phase differences within the range of −2 to +2, and for the other phase differences F (=1) is read out. Thus the device under test is evaluated on the pass/fail basis. In this case, it is also possible to use only one reference table 80 adapted to switch for each data phase number DNO.

Figure 22:
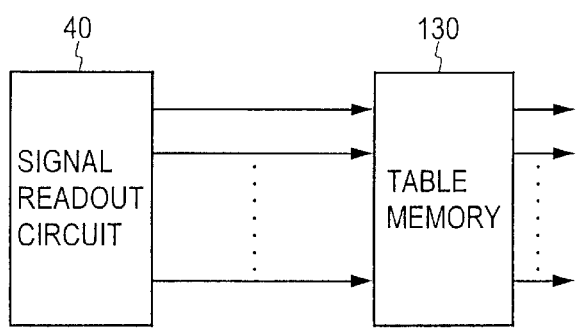
FIG. 22 is a diagram depicting a modified form of phase number output means 10 in FIG. 6.

The phase number output means 110 in FIG. 16 (110D and 110R in FIGS. 13 and 19) may also have such a configuration as depicted in FIG. 22. That is, the output of eight bits, for instance) from the signal readout circuit 40 is used as an address to access a table memory 130 to read out thereof any one the pieces of data D0 to D7 (F1 to F8 in FIG. 14) as the phase number.

As described above, according to another aspect of the present invention, the semiconductor device under test can be tested for normal operation, by measuring in real time the phase difference (time difference) between the point of change of the reference clock and the point of change of each piece of data, and by deciding whether the phase difference is within a predetermined range, or whether the point of change of the device output data is before or after the point of change of the reference clock. The test involves only one round of generation of test patterns. Hence, the test can be completed in a shorter time than in the past.

Moreover, by storing the output values of the phase comparison parts 60 in memories during the test, it is also possible to analyze fluctuations or jitter of the phase differences between the device output data and the reference clock.

It will be apparent that many modifications and variations may be effected without departing from the scope of the novel concepts of the present invention.

What is claimed is:

1. A semiconductor device testing method which evaluates a semiconductor device under test by obtaining the phase differences between points of change of data output from said semiconductor device under test and points of change of reference clock output in synchronization with said output data, said method comprising the steps of:
    generating multiphase strobe pulses phased apart one after another with respect to a predetermined phase position of each test cycle;
    sampling said reference clock by using said multiphase strobe pulses to obtain sampled outputs; and
    detecting the phases of the points of change of said reference clock from said sampled outputs.

2. The method of claim 1, further comprising the steps of:
    converting the phases of the points of change of said detected reference clock to phase numbers of said multiphase pulses and storing said phase numbers in a memory; and
    obtaining said phase differences by reading out the phase numbers stored in said memory.

3. The method of claim 2, wherein: the detection of the phases of the points of change of said reference clock and the conversion of said phases to the corresponding phase numbers are performed for all addresses of said semiconductor device under test; the converted phase numbers are stored in said memory in addresses corresponding to those of said semiconductor device under test; and said phase differences are obtained by reading out said phase numbers from said memory at the addresses corresponding the address signals that are applied to said semiconductor device under test.

4. The method of claim 2, wherein the detection of the phases of the points of change of said each reference clock and the conversion of said phases to the corresponding phase numbers are performed in the order of generation of test patterns that are applied to said semiconductor device under test; said phase numbers are stored in said memory at addresses indicating said order of generation of said test patterns; and said phase differences are obtained by reading out said phase numbers from said memory at addresses indicating the order of generation of said test patterns that are applied to said semiconductor device under test.

5. The method of claim 2, wherein strobe pulses are generated at timing preset corresponding to the phase numbers read out of said memory; and said phase differences are obtained by reading out logical values of said output data from said semiconductor device under test at the timing of said strobe pulses.

6. The method of claim 1, further comprising the steps of:
    storing the phases of the points of change of said detected reference clock in a memory;
    obtaining said phase differences by reading out the phases of the points of change of said reference clock stored in said memory; and
    converting said read-out phases of the points of change to the phase numbers of said multiphase pulses.

7. The method of claim 1, further comprising the steps of:
    sampling the output data of said device under test by said multiphase strobe pulses;
    detecting the phases of the points of change of said output data from said sampled outputs; and
    measuring the phase differences between the phases of the points of change of said detected reference clock and the phases of the points of change of said device output data.

8. The method of claim 7, further comprising the steps of:
    converting the phases of the points of change of said detected reference clock and the phases of the points of change of said detected device output to the phase numbers of said multiphase pulses;
    obtaining the differences between said converted phase numbers of said reference clock and said converted phase numbers of said device output data; and
    making a check to determine if the values of said differences each fall within a predetermined range.

9. The method of claim 7, further comprising the steps of:
    converting the phases of the points of change of said detected reference clock and the phases of the points of change of said detected device output to the phase numbers of said multiphase pulses; and accessing a reference table by said converted phase numbers of said reference clock and said device output data to read out thereof pass/fail results on said device under test.

10. A semiconductor device testing method which evaluates a semiconductor device under test by obtaining the phase differences between points of change of data output from said semiconductor device under test and points of change of reference clock output in synchronization with said output data, said method comprising the steps of:

premeasuring, for each test cycle, the phases of the points of changes of said reference clock and storing said premeasured phases in a memory at addresses corresponding to said each test cycle; and obtaining, for each test cycle, said phase differences by reading out the phases from said memory at the addresses corresponding to said each test cycle to determine a reference phase for said evaluation.

11. A semiconductor device testing apparatus which evaluates a semiconductor device under test by obtaining the phase differences between points of change of data output from said semiconductor device under test and points of change of a reference clock output from said semiconductor device under test in synchronization with said output data, said apparatus comprising:

a multiphase pulse generator for generating phased-apart multiphase strobe pulses;

a plurality of reference signal readout circuits each for sampling said reference clock by a different one of said multiphase strobe pulses; and reference phase number output means supplied with the outputs from said plurality of reference signal readout circuits, for outputting the phase numbers of said multiphase strobe pulses immediately following the points of change of said reference clock as the phases of the points of change of said reference clock.

12. The apparatus of claim 11, further comprising:

a data readout circuit for reading out the logical value of the output data from said semiconductor device at the timing of application of a strobe pulse to said data readout circuit;

a memory for storing the phase numbers from said reference phase number output means at addresses corresponding to addresses of said semiconductor device under test;

a timing selector for selecting predetermined strobe pulse generation timing according to the phase number read out of said memory at the address corresponding to an address applied to said semiconductor device under test; and a strobe generator for generating said strobe pulse for application to said data readout circuit according to the timing value selected by said timing selector.

13. The apparatus of claim 11, further comprising:

a data readout circuit for reading out the logical value of the output data from said semiconductor device at the timing of application of a strobe pulse to said data readout circuit;

a memory for storing the phase numbers from said reference phase number output means at addresses corresponding to addresses of said semiconductor device under test;

a timing selector for selecting predetermined strobe pulse generation timing according to the phase number read out of said memory at the address corresponding to an address applied to said semiconductor device under test; and a strobe generator for generating said strobe pulse for application to said data readout circuit based on the timing value selected by said timing selector.

14. The apparatus of claim 11, wherein said multiphase pulse generator is formed by a plurality of delay elements which have slightly different delay times and are connected at one end to form a pulse input terminal, each of the other ends of said plurality of delay elements serving as an output terminal for one of said multiphase strobe pulses.

15. The apparatus of claim 11, wherein said multiphase pulse generator is formed by a cascade connection of delay elements of the same delay time, one end of said cascade connection serving as a pulse input terminal and each of the connection points of said delay elements as an output terminal for one of said multiphase strobe pulses.

16. The apparatus of claim 11, wherein said reference phase number output means comprises:

a plurality of comparison/decision means which are each supplied with the output from one of said plurality of reference signal readout circuits, and are each made to correspond to the phase number of said strobe pulse that is applied to said one reference signal readout circuit whose output is provided to said each comparison/decision means, said each comparison/decision means comprising said output from said one reference signal readout circuit and the output from that one of said comparison/decision means whose phase number is lower than the phase number of said strobe pulse by one and outputting an invalidity signal or invalidity signal, depending on whether a mismatch is found between said compared outputs; and a phase number converter supplied with the outputs from said comparison/decision means, for outputting the phase number of that one of said comparison/decision means that output said validity signal.

17. The apparatus of claim 16, wherein said reference signal readout circuits are that for the rising transition point of said reference clock and that for the falling transition point of said reference clock, and said each comparison/decision means has a circuit for switching between the input from said reference signal readout circuit for the rising transition point and the input from said reference signal readout circuit for the falling transition point.

18. The apparatus of claim 11, wherein said reference phase number output means is a table memory which is supplied with the outputs from said reference signal readout circuits as addresses and outputs the phase numbers of said multiphase strobe pulses.

19. The apparatus of claim 11, further comprising:

a data readout circuit for reading out the logical value of the output data from said semiconductor device under test at the timing of application of the strobe pulse to said data readout circuit;

a memory for storing the outputs from said reference readout circuits at specified addresses;

a phase number output means to which, upon application of a lest pattern to said semiconductor device under test, is input data read out from said memory at the address corresponding to the address where said data was stored and which outputs the phase number of said strobe pulse immediately following the point of change of said reference clock as the phase of the point of change of said reference clock;

a timing selector or selecting a predetermined strobe pulse generation timing value according to the phase number output from said phase number output means; and a strobe generator for generating the strobe pulse for application to said data readout circuit according to said timing value selected by said timing selector.

20. The apparatus of claim 11, further comprising:

plural data signal readout circuit group, each consisting of plural data readout circuits each for sampling the output data from said semiconductor device under test by a different one of said strobe pulses;

plural data phase number output means which are supplied with the outputs from said data signal readout circuits of said plural data signal readout circuit groups and output the phase numbers of the strobe pulses immediately following the points of change of the output data from said semiconductor under test; and a pass/fail results output part which is supplied with the phase numbers from said plural data phase number output means and the phase number from said reference phase number output means and outputs pass/fail results on the decision whether the phase differences between the points of changes of said output data and said reference clock falls within a predetermined range.

21. The apparatus of claim 20, wherein said pass/fail results output part comprises:

plural phase comparison parts for detecting the phase number from said reference phase number output means and each of the phase numbers from said plural data phase number output means; and pass/fail decision means for deciding whether the phase differences from said phase comparison parts fall within a predetermined range.

22. The apparatus of claim 20, wherein said pass/fail results output part comprises a plurality of reference tables which are supplied, at the one address, with the phase number from said reference phase number output means and, at the other address, with the phase number from each of said plural data phase number output means which output pass/fail results, respectively.

23. The apparatus of claim 20, wherein: said data signal readout circuits are said reference signal readout circuits are that for the rising transition point of said reference clock and that for the falling transition point of said reference clock; said plurality of data phase number output means each comprises:

a plurality of comparison/decision means which are provided for each of said plural data signal readout circuit group and supplied with the output from said plural data signal readout circuits of said each group end each of which has a circuit responsive to an expected value to switch its input between the data readout circuit for the rising transition point of said output data and the data readout circuit for the falling transition point of said output data, said each comparison/decision means being made to correspond to the phase number of said strobe pulse that is applied to that one of said reference signal readout circuits whose output is provided to said each comparison/decision means and said each comparison/decision means comparing said output from said one data signal readout circuit and the output from that one of said comparison/decision means whose phase number is lower than the phase number of said strobe pulse by one and outputting an invalidity signal or invalidity signal, depending on whether a mismatch is found between said compared outputs; and a phase number converter supplied with the outputs from said comparison/decision means, for outputting the phase number of that one of said comparison/decision means that output said validity signal.

24. The apparatus of claim 20, wherein said each data phase number output means is a table memory which is supplied with the outputs from said plural data signal readout circuits of the corresponding group as addresses and outputs the phase numbers of said multiphase strobe pulses.

* * * * *